(12) United States Patent
Erlat et al.

(10) Patent No.: US 8,033,885 B2
(45) Date of Patent: Oct. 11, 2011

(54) SYSTEM AND METHOD FOR APPLYING A CONFORMAL BARRIER COATING WITH PRETREATING

(75) Inventors: Ahmet Gun Erlat, Clifton Park, NY (US); George Theodore Dalakos, Niskayana, NY (US); Min Yan, Ballston Lake, NY (US); Shelia Neumann Tandon, Niskayuna, NY (US); Brian Joseph Scherer, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 281 days.

(21) Appl. No.: 12/242,399

(22) Filed: Sep. 30, 2008

(65) Prior Publication Data
US 2010/0079060 A1    Apr. 1, 2010

(51) Int. Cl.
*H05B 33/04* (2006.01)
(52) U.S. Cl. .......................... 445/25; 313/512
(58) Field of Classification Search .................. 313/512; 445/25; 427/66
See application file for complete search history.

(56) References Cited

U.S. PATENT DOCUMENTS

| | | |
|---|---|---|
| 3,932,693 A | 1/1976 | Shaw et al. |
| 4,540,763 A | 9/1985 | Kirchhoff |
| 4,552,791 A | 11/1985 | Hahn |
| 5,185,391 A | 2/1993 | Stokich |
| 5,462,779 A | 10/1995 | Misiano et al. |
| 5,654,084 A | 8/1997 | Egert |
| 5,683,757 A | 11/1997 | Iskanderova et al. |
| 5,736,207 A | 4/1998 | Walther et al. |
| 5,757,126 A | 5/1998 | Harvey et al. |
| 5,998,803 A | 12/1999 | Forrest et al. |
| 6,023,371 A | 2/2000 | Onitsuka et al. |
| 6,097,147 A | 8/2000 | Baldo et al. |
| 6,200,863 B1 * | 3/2001 | Xiang et al. ................ 438/286 |
| 6,268,695 B1 | 7/2001 | Affinito |
| 6,291,116 B1 | 9/2001 | Wolk et al. |
| 6,306,688 B1 * | 10/2001 | Lunceford .................. 438/127 |

(Continued)

FOREIGN PATENT DOCUMENTS

JP    200498525 A    4/2004

(Continued)

OTHER PUBLICATIONS

H. Suzuki et al., Near-Ultraviolet Electroluminescence from Polysilanes 331 Thin Solid Films 64-70 (1998).

(Continued)

*Primary Examiner* — Karabi Guharay
(74) *Attorney, Agent, or Firm* — Jean K. Testa

(57) ABSTRACT

In a method for depositing a barrier coating, a device is provided comprising a first portion and a second portion where a surface of the second portion is in a shadow zone. The device is pretreated wherein the pretreating alters a deposition rate of the barrier coating on a surface exposed to the pretreating. The shadow zone is substantially unexposed to the pretreating. A barrier coating is deposited wherein the barrier coating substantially conforms to a profile of the device. The coating may be a graded-composition barrier coating wherein a composition of the coating varies substantially continuously across a thickness thereof. The first portion may include a flexible, substantially transparent substrate. The second portion may include an electronic device. The barrier coating and first portion may encapsulate the second portion. The method is a single, commercially advantageous, barrier deposition process, enabling increased product throughput and low process tact time.

36 Claims, 21 Drawing Sheets

U.S. PATENT DOCUMENTS

| | | |
|---|---|---|
| 6,413,645 B1 | 7/2002 | Graff et al. |
| 6,522,067 B1 | 2/2003 | Graff et al. |
| 6,576,351 B2 | 6/2003 | Silvernail |
| 6,642,652 B2 | 11/2003 | Collins, III et al. |
| 6,777,871 B2 | 8/2004 | Duggal et al. |
| 6,869,329 B2 | 3/2005 | Clark |
| 6,911,667 B2 | 6/2005 | Pichler et al. |
| 6,949,389 B2 | 9/2005 | Pichler et al. |
| 6,995,035 B2 | 2/2006 | Cok et al. |
| 7,015,640 B2 | 3/2006 | Schaepkens et al. |
| 7,121,912 B2 | 10/2006 | Ghosh |
| 7,408,296 B2 | 8/2008 | Cok et al. |
| 7,486,020 B2 * | 2/2009 | Schaepkens et al. ......... 313/512 |

FOREIGN PATENT DOCUMENTS

| | | |
|---|---|---|
| WO | 0026973 A1 | 5/2000 |
| WO | 0181649 A1 | 11/2001 |
| WO | 0182336 A2 | 11/2001 |

OTHER PUBLICATIONS

Gijsbert Jan Meeusen, "Plasma Beam Deposition of Amorphous Hydrogenated Silicon," Thesis, University of Eindhoven, pp. 16-19 (1994).

Bastiaan Arie Korevaar, "Integration of Expanding Thermal Plasma Deposited Hydrogenated Amorphous Silicon in Solar Cells," Thesis, University of Eindhoven, pp. 23-34 (2002).

V.J. Law et al., "RF Probe Technology for the Next Generation of Technological Plasmas," J. Phys. D: Appl. Phys., 34, 2726-2733 (2001).

* cited by examiner

SYSTEM AND METHOD FOR APPLYING A CONFORMAL BARRIER COATING WITH PRETREATING

RELATED APPLICATIONS

The instant application is co-pending with and related to U.S. application Ser. No. 12/242,443, filed, Sep. 30, 2008, entitled "System and Method for Applying a Conformal Barrier Coating," the entirety of which is incorporated herein by reference.

BACKGROUND

The present disclosure is directed generally towards thin film composite barrier coatings having improved resistance to diffusion of chemical species and to devices incorporating such composite thin film coatings. In particular, the present disclosure relates to electronic devices, such as organic light emitting diodes ("OLEDs"), that incorporate such composite thin film coatings and have improved stability in the environment.

As is well known in the art, electronic devices, and display technologies such as OLEDs, require ultra high barrier protection against oxygen, moisture and other gases. Conventional electronic devices are built on glass or metal substrates because of the low permeability of glass or metal to oxygen and water vapor. High permeability of these and other reactive species can lead to corrosion or other degradation of the devices. However, glass and metal substrates are not suitable for certain applications in which flexibility is desired. In addition, manufacturing processes involving large glass and metal substrates are inherently slow and, therefore, result in high manufacturing cost.

Flexible plastic substrates have been used to build electronic devices. However, these substrates are not impervious to oxygen and water vapor, and, thus, are not suitable per se for the manufacture of long-lasting electronic devices. In order to improve the resistance of these substrates to oxygen and water vapor, alternating layers of polymeric and ceramic materials have been applied to a surface of a substrate. It has been suggested that in such multilayer barriers, a polymeric layer acts to mask any defects in an adjacent ceramic layer to reduce the permeation rates of oxygen and/or water-vapor through the channels made possible by the defects in the ceramic layer. However, an interface between a polymeric layer and a ceramic layer is generally weak due to the incompatibility of the adjacent materials, and the layers, thus, are prone to be delaminated.

Graded-composition barrier coatings disposed on the surfaces of electronic devices and substrates such as those disclosed in U.S. Pat. No. 7,015,640, have been used to reduce permeation rates of chemical species therethrough. These barrier coatings comprise a material the composition of which varies substantially continuously across a thickness thereof. The graded composition barrier coating provides reduced permeation rates for water vapor and oxygen as well as other chemical species and may be suitable for many applications, such as devices in which flexibility is desired. During deposition, varying the relative supply rates or changing the identities of reacting species results in a coating that has a graded composition of reaction or recombination products of the reacting species across its thickness. The graded composition barrier coating does not have distinct interfaces at which the composition changes abruptly, rather it has a substantially continuous transition of materials.

However, many organic electronic devices, both rigid and flexible, have severe surface topology where surface features can significantly exceed the thickness of the thin film barrier coating deposited using a method known in the art. For example, passive matrix displays may possess geometry, or severe surface features, usually microns high, that make it difficult for the barrier coating to completely and hermetically cover the surface features over large areas. This geometry may create a "shadow zone." Furthermore, the presence of contamination particles on any desired coating surface may create a shadow zone or prevent deposition of an effective diffusion barrier coating through traditional prior art methods or a baseline method that is optimized for a substantially planar device.

As a result, there is a continued need for robust films that have reduced permeation rates of environmentally reactive materials. It is also desirable to provide such films to produce flexible electronic devices that are robust against degradation due to environmental elements.

This problem has previously been addressed in a combination of separate processes. In a method known in the art, a substantially thick smoothing or planarizing layer is deposited on the device, using a wet coating technique such as spincoating, dipcoating, spraycoating, etc. Subsequently, a separate barrier coating deposition process, such as plasma enhanced chemical vapor deposition (PECVD), is used to deposit a barrier coating on the device. The combination of the primary barrier coating process with a second wet or dry coating process is expensive, decreases product throughput and increases process tact time.

Therefore, there is a need for a novel barrier coating configuration that enables the continuous and effective coverage over such severe surface topology, in a single barrier deposition process, thereby protecting the device from degradation due to the ingress of harmful permeants while simultaneously providing a commercially advantageous, low tact time encapsulation process. Such a barrier coating will substantially conform to a profile of the device. "Substantially conforming," "substantially conformal," or "substantially conforms" are terms that will be used interchangeably hereinafter and mean that a thickness of a property is approximately equivalent about the area or along the surface being described as possessing this property.

Accordingly, an embodiment of the present disclosure includes an improvement of a baseline method of depositing a coating on a device having a first portion and a second portion, where the second portion is in a shadow zone and where the coating is deposited using a first predetermined set of process parameters having a first ratio of a thickness of the coating on the second portion to a thickness of the coating on the first portion. In the improved method of an embodiment of the disclosure, the coating is deposited on the device using a second set of predetermined process parameters such that the coating substantially conforms to a profile of the device and a second ratio of a thickness of the coating on the second portion to a thickness of the coating on the first portion is greater than the first ratio using the baseline method.

An additional embodiment includes an improvement of a baseline method of depositing a barrier coating on a device having a first portion and a second portion, where a surface of the second portion is in a shadow zone and where the barrier coating comprises a substantially continuous transition from a substantially inorganic zone deposited at a first thickness to a substantially organic zone deposited at a second thickness and a buffer layer deposited using a reactive ion etching PECVD deposition mode ("RIE mode"), resulting in a first water ingress rate. "RIE mode," as used herein, refers to a PECVD deposition configuration where a substrate, for example, is placed on the powered electrode. A plasma enhanced mode ("PE mode"), as used herein, refers to a configuration where a substrate, for example, is placed on the ground electrode. The improvement of the baseline method includes depositing the substantially inorganic zone at a third thickness and depositing the substantially organic zone at a fourth thickness wherein the third thickness is greater than the first thickness and the fourth thickness is greater than the second thickness, and depositing the buffer layer in PE mode, resulting in a second water ingress rate wherein the second water ingress rate is less than the first water ingress rate.

Another embodiment of the present subject matter describes a method for depositing a barrier coating where the method provides a device having a surface with a first surface portion and a second surface portion where a surface of the second surface portion is in a shadow zone, where the device is pretreated such that the deposition rate of a barrier coating on the first surface portion is altered and where the shadow zone is substantially unexposed to the pretreating, and where the barrier coating is deposited on the first and second surface portions, substantially conforming to a profile of the device.

A further embodiment includes a method for depositing a barrier coating where an apparatus is provided having a substrate and an electronic device, where a surface of the electronic device is in a shadow zone, where the apparatus is pretreated such that a deposition rate is altered on a surface exposed to the pretreating and where the shadow zone is substantially unexposed to the pretreating, and where a graded-composition barrier coating, having an organic and inorganic material composition that varies substantially continuously across a thickness thereof, is deposited using plasma enhanced chemical vapor deposition such that the barrier coating substantially conforms to a profile of the apparatus.

Yet another embodiment of the present subject matter provides an apparatus having a substrate, an electronic device attached to the substrate where a surface of the electronic device is in a shadow zone and the surface has a deposition rate of a barrier coating different than a deposition rate of the barrier coating on a surface outside of the shadow zone, and a graded-composition barrier coating substantially conforming to a profile of the apparatus where the coating comprises an organic and an inorganic material, the composition of which varies substantially continuously across a thickness thereof.

These embodiments and many other objects and advantages thereof will be readily apparent to one skilled in the art to which the invention pertains from a perusal of the claims, the appended drawings, and the following detailed description of the embodiments.

BRIEF DESCRIPTION OF THE DRAWINGS

FIG. 13 shows a cross-sectional representation of a coating deposited on a device according to a non-limiting example using the baseline method of FIG. 6a.

FIG. 14 is a graphical representation of normalized thickness of the coating deposited on the device according to the non-limiting example of FIG. 13 and using the baseline method of FIG. 6a.

FIG. 17 shows a cross-sectional representation of a graded-composition barrier coating deposited on a test structure having a Calcium layer deposited on a surface of the structure during a room temperature shelf life test according to a non-limiting example using a baseline method of FIG. 7a.

FIG. 18 shows a top down view of the test structure of FIG. 17 and the ingress of water vapor at a junction of the test structure of FIG. 17 according to the non-limiting example of FIG. 17 and using a baseline method of FIG. 7a.

DETAILED DESCRIPTION

Figure 1:
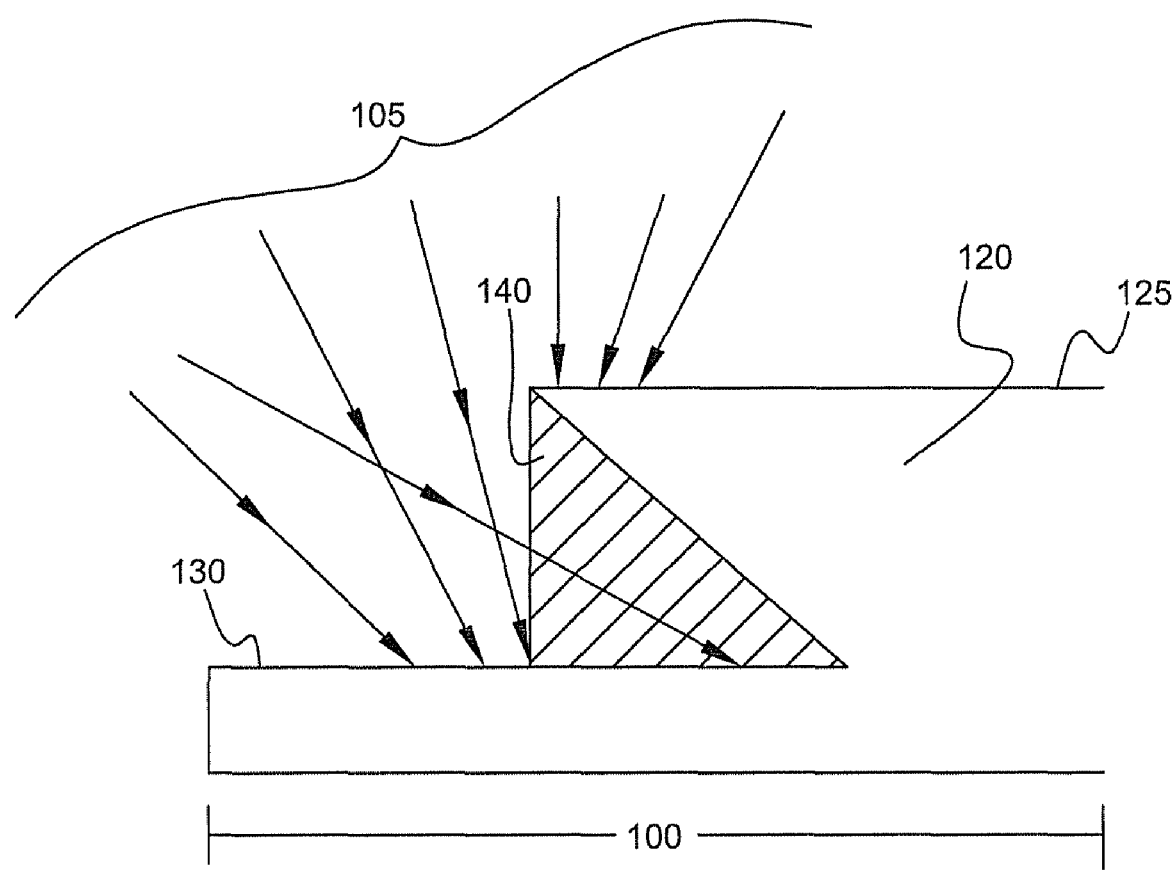
FIG. 1 shows an example of the impingement of deposition flux on an example of a device having a shadow zone according to an embodiment of the present disclosure.

With reference to the Figures where generally like elements have been given like numerical designations to facilitate an understanding of the present subject matter, the various embodiments of a method for depositing a substantially conformal barrier coating on a device and an apparatus with a substantially conformal barrier coating are herein described.

The following description of the present subject matter is provided as an enabling teaching of the present subject matter and its best, currently-known embodiment. Those skilled in the art will recognize that many changes can be made to the embodiments described herein while still obtaining the beneficial results of the present subject matter. It will also be apparent that some of the desired benefits of the present subject matter can be obtained by selecting some of the features of the present subject matter without utilizing other features. Accordingly, those who work in the art will recognize that many modifications and adaptations of the present subject matter are possible and may even be desirable in certain circumstances and are part of the present subject matter. Thus, the following description is provided as illustrative of the principles of the present subject matter and not in limitation thereof. While the following exemplary discussion of embodiments of the present subject matter may be directed primarily towards a method of depositing a conformal barrier coating on electronic devices and an apparatus comprising a substrate, an electronic device, and a conformal graded-composition barrier coating, it is to be understood that the discussion is not intended to limit the scope of the present subject matter in any way and that the principles presented are equally applicable to depositing a conformal barrier coating on other types of devices.

The present subject matter is directed generally to the problem of depositing a substantially conformal barrier coating, in a single deposition process, on a device to protect the device against degradation due to the ingress of permeants such as oxygen and moisture.

As used herein, use of a singular article such as "a," "an" and "the" is not intended to exclude pluralities of the article's object unless the context clearly and unambiguously dictates otherwise.

With reference now to FIGS. 1-5, several examples of devices of varying geometries are shown according to various embodiments of the present disclosure. These examples are illustrative only and are not intended to limit the scope of the disclosure. It will be apparent to one skilled in the art that various modifications and variations can be made without departing from the spirit or scope of the present subject matter.

Each device (100, 200, 300, 400, 500) has a shadow zone (140, 230, 330, 430, 530). A "shadow zone" as used herein refers to an area adjacent to and including the exterior surfaces along a profile of a device where impingement by a deposition flux is less than impingement by the deposition flux on an area outside of the shadow zone. Areas and surfaces within a shadow zone (140, 230, 330, 430, 530) may have a different deposition rate than areas and surfaces outside of the shadow zone. A "deposition rate" as used herein refers to an affinity of a surface or area toward a deposition flux of reaction or recombination products of reacting species, fed into a reactor chamber during deposition, and the amount of reaction or recombination products impinging on the surface or area.

FIG. 1 shows a non-limiting example of the impingement of a plurality of vectors of a deposition flux 105 on an example of a device 100 having a substantially trapezoidal shaped second portion 120 disposed on a first portion 130 and having a shadow zone 140 according to an embodiment of the present disclosure. The deposition flux 105 directs radicals in a plasma from a plurality of directions relative to the device 100 on to the surfaces of the device 100, and impinges a surface of the substantially planar first portion 130 and a substantially planar surface 125 of the substantially trapezoidal shaped second portion 120 at a first deposition rate. The deposition flux 105 is shadowed by the geometry of the device 100 in the shadow zone 140, such that the deposition flux 105 impinges an area adjacent to and including the exterior surfaces along a profile of the device 100 within the shadow zone 140 at a second deposition rate. As illustrated in FIG. 1, the geometry of the device 100 inhibits a substantial number of the plurality of vectors of the deposition flux 105 from impinging on the exterior surface along a profile of the device 100 within the shadow zone 140. Thus, the shadow zone 140 is substantially unexposed to the deposition flux 105. For example, a vector of the deposition flux 105 directed at a direction normal to the device 100 would be shadowed by the geometry of the device 100 in the shadow zone 140, inhibiting the normal vector from impinging on an area adjacent to and including the exterior surfaces along a profile of the device 100 within the shadow zone 140. Thus, the second deposition rate (i.e. a deposition rate of the exterior surfaces along a profile of the device 100 and within the shadow zone 140) is less than the first deposition rate (i.e. a deposition rate of a substantially planar, surface 125 of the substantially trapezoidal shaped second portion 120 or a surface of the substantially planar first portion 130).

Figure 2:
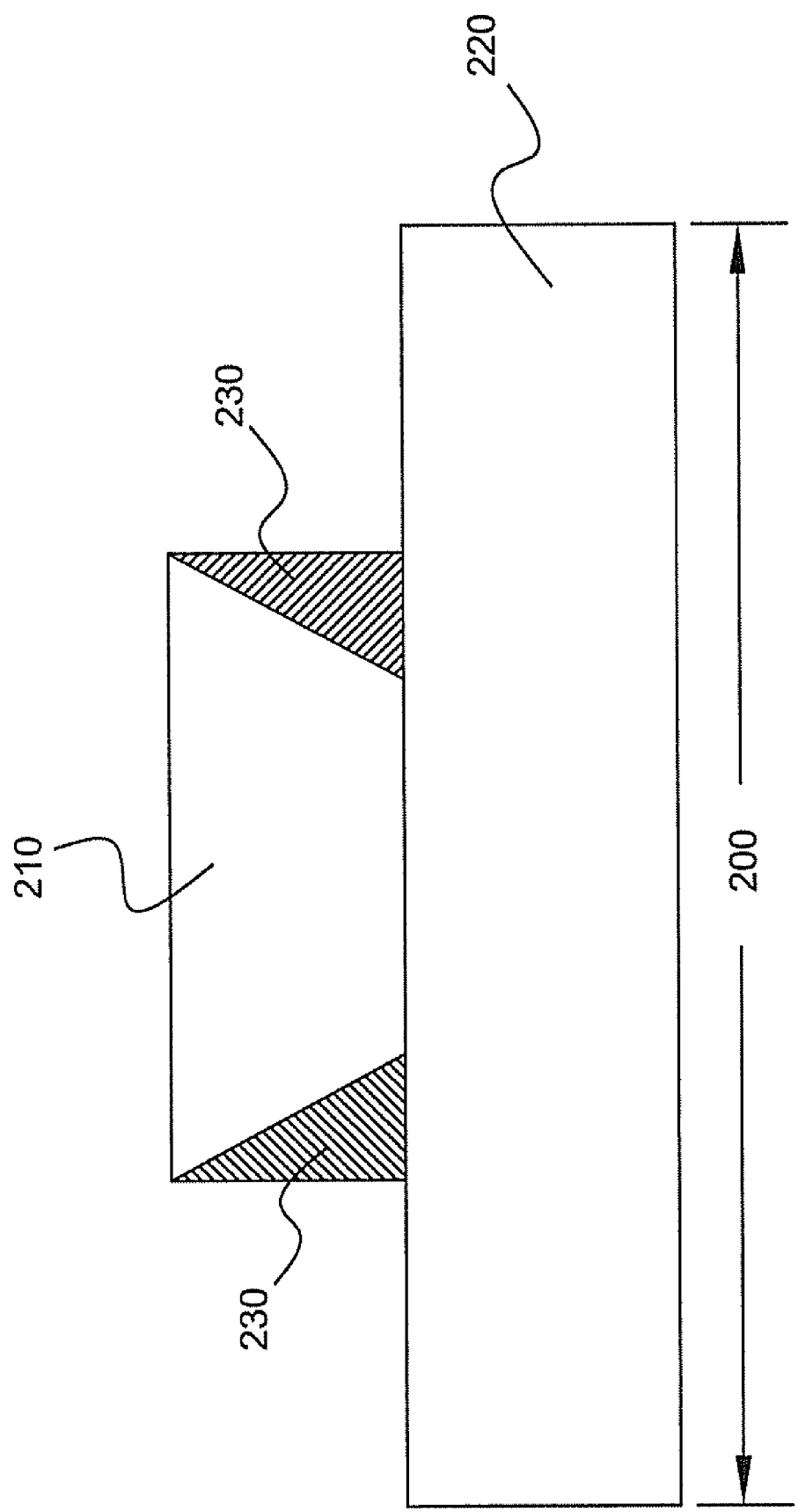
FIG. 2 shows an example of a device having a shadow zone according to an embodiment of the present disclosure.

FIG. 2 shows an example of a device 200 having a substantially trapezoidal shaped second portion 210 disposed on a first portion 220 and having a shadow zone 230 according to an embodiment of the present disclosure.

Figure 3:
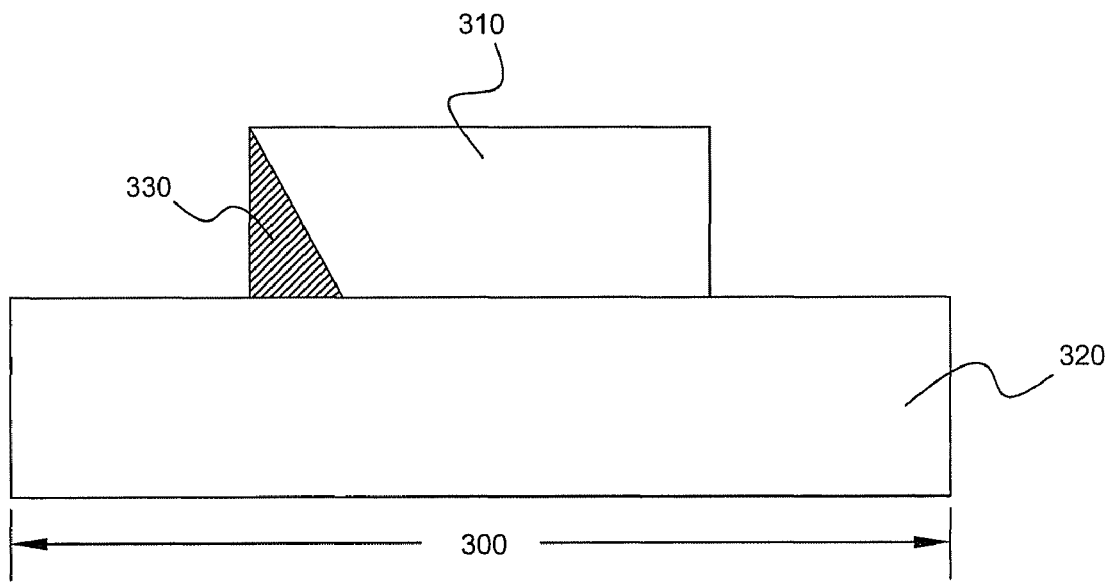
FIG. 3 shows an additional example of a device having a shadow zone according to an additional embodiment of the present disclosure.

FIG. 3 depicts an additional example of a device 300 having a non-symmetrical, substantially trapezoidal shaped second portion 310 disposed on a first portion 220 and having a shadow zone 330 according to an additional embodiment.

Figure 4:
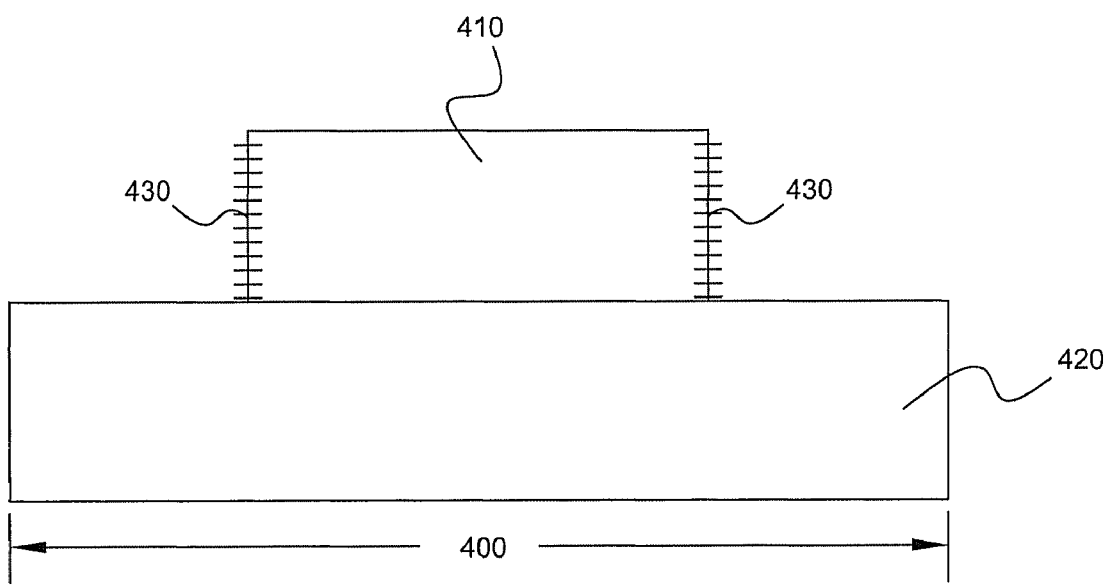
FIG. 4 shows another example of a device having a shadow zone according to another embodiment.

FIG. 4 is a further example of a device 400 having, a substantially rectangular shaped second portion 410 disposed on a first portion 420 and having a shadow zone 430 according to an embodiment of the present subject matter.

Figure 5:
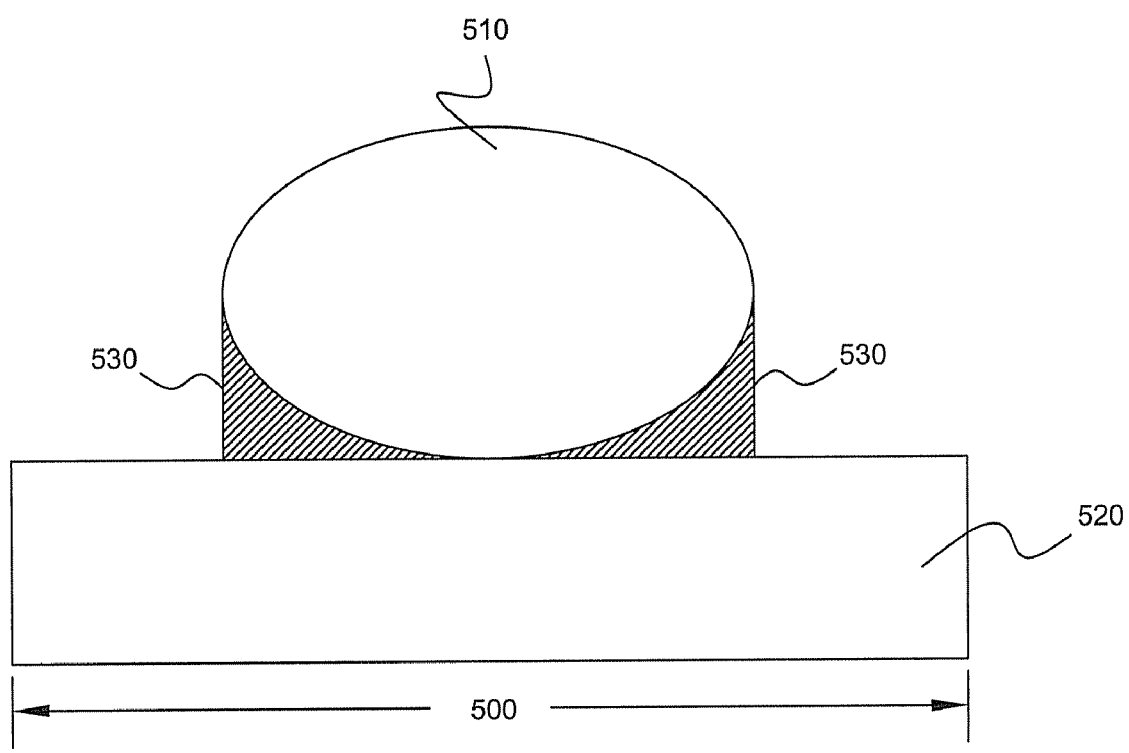
FIG. 5 shows a further example of a device having a shadow zone according to a further embodiment of the present subject matter.

FIG. 5 illustrates another example a device 500 having a substantially spherical shaped second portion 510 disposed on a first portion 520 and having a shadow zone 530 according to another embodiment of the present disclosure.

As illustrated by the non-limiting examples depicted in FIGS. 1-5, the term "shadow zone" may also comprise an area or surface along a profile of the device that is normal relative to an exposed surface of the device. The term may further include a substantially unexposed area adjacent to and including the exterior surface along a profile of a device defined by an acute angle at or tangential to the intersection of a first and a second surface portion of the device. In a method using plasma enhanced chemical vapor deposition, the term "shadow zone" may also incorporate an area adjacent to and including the exterior surfaces along a profile of a device that is substantially unexposed relative to a direction of deposition within the PECVD reactor. Furthermore, the presence of contamination particles on any desired coating surface may create a shadow zone as defined herein.

Figure 6A:
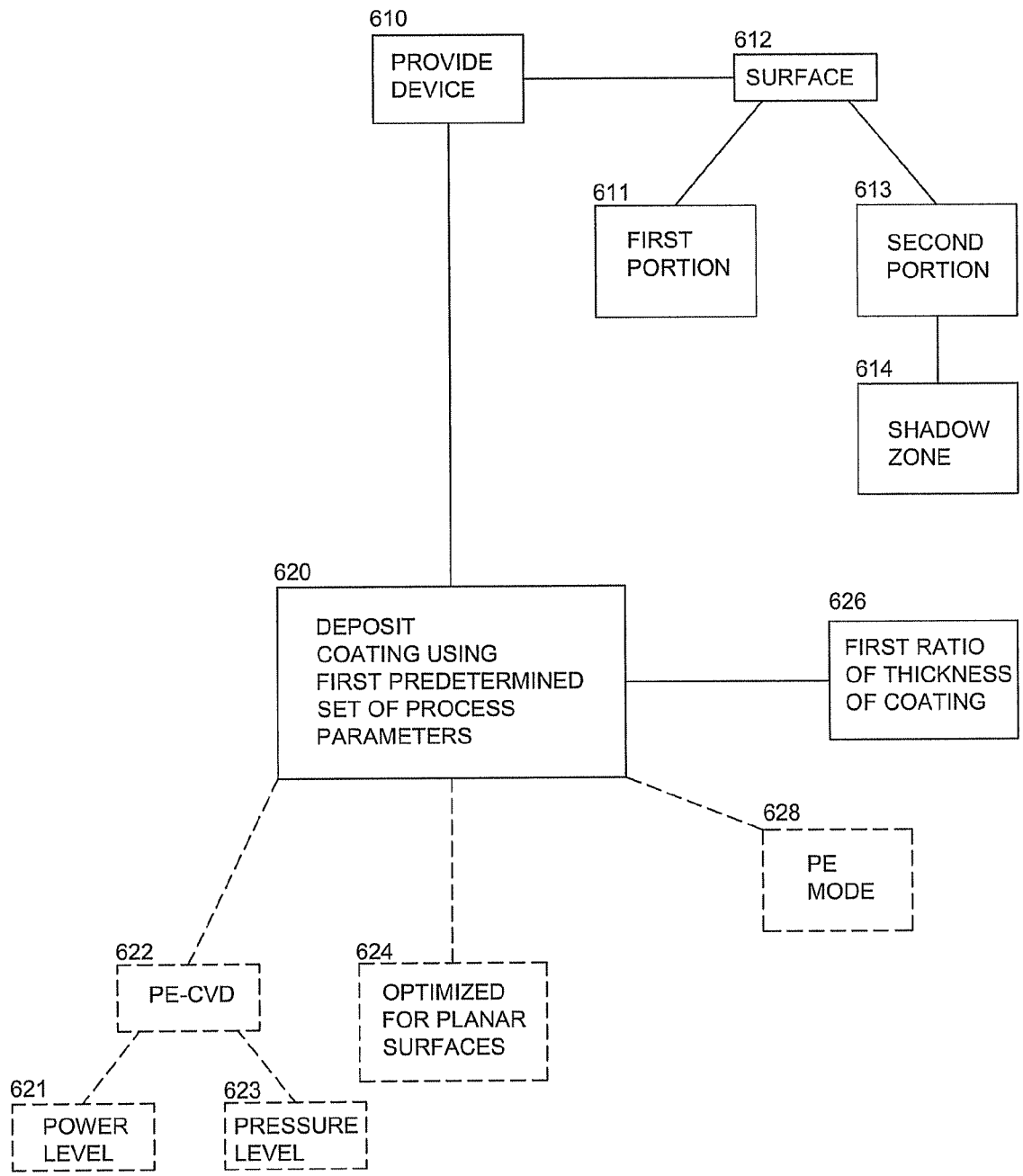
FIG. 6a is a flow chart for a baseline method of depositing a coating on a device.

With reference now to FIG. 6a, a flow chart is depicted for a baseline method of depositing a coating on a device. At block 610, a device is provided. In the baseline method, the device comprises a surface 612 having a first portion 611 and a second portion 613. The second portion 613 is in a shadow zone as depicted at block 614.

At block 620, a coating is deposited using a first predetermined set of process parameters. In an embodiment of the present disclosure, the coating may comprise a substantially inorganic zone wherein the substantially inorganic zone further comprises an inorganic material including, but not limited to: oxide, nitride, carbide, boride, and combinations thereof of elements of Groups IIA, IIIA, IVA, VA, VIA, VIIA, IB, and IIB, metals of Groups IIIB, IVB, and VB, and rare-earth metals. In another embodiment, the coating may comprise a substantially organic zone wherein the substantially organic zone may further comprise an organic material such as, but not limited to, carbon, hydrogen, and oxygen. The organic material may further comprise other minor elements, such as sulfur, nitrogen, silicon, etc., depending on the types of reactants. Reactants that result in an organic composition may include, but are not limited to: straight or branched alkanes, alkenes, alkynes, alcohols, aldehydes, ethers, alkylene oxides, and aromatics. For example, silicon oxycarbide may be deposited from plasmas generated from silane, methane, and oxygen or silane and propylene oxide. Silicon oxycarbide may also be deposited from plasmas generated from organosilicone radicals, such as tetraethoxysilane (TEOS), hexamethyldisiloxane (HMDSO), hexamethyldisilazane (HMDSN), or octamethylcyclotetrasiloxane (D4). In an additional embodiment, the coating may comprise a graded composition barrier coating. In an embodiment, the graded composition barrier coating may further comprise a material such as organic, inorganic, ceramic, and combinations thereof. In a further embodiment, the graded composition barrier coating may further comprise an organic and an inorganic material. In an exemplary embodiment of the present disclosure, a composition of the graded composition barrier coating varies substantially continuously across a thickness thereof.

In the baseline method, the first predetermined set of process parameters includes a ratio 626 of a thickness of the coating on the second portion to a thickness of the coating on the first portion. In the baseline method, the first predetermined set of process parameters may be optimized for depositing a coating on a substantially planar surface as shown in block 624. The first predetermined set of process parameters may include one of many deposition coating techniques such as radio-frequency plasma-enhanced chemical-vapor deposition, expanding thermal-plasma chemical-vapor deposition, electron-cyclotron-resonance plasma-enhanced chemical-vapor deposition, inductively-coupled plasma-enhanced chemical-vapor deposition, and sputtering such as reactive magnetron sputtering, and combinations thereof. In an exemplary embodiment, the first predetermined set of process parameters may include plasma enhanced chemical vapor deposition (PECVD) process parameters as depicted at block 622. The first set of predetermined process parameters may also include a power level 621 and pressure level 623 used during the PECVD process. In an alternate embodiment, the first predetermined set of process parameters may include PE mode deposition 628.

Figure 6B:
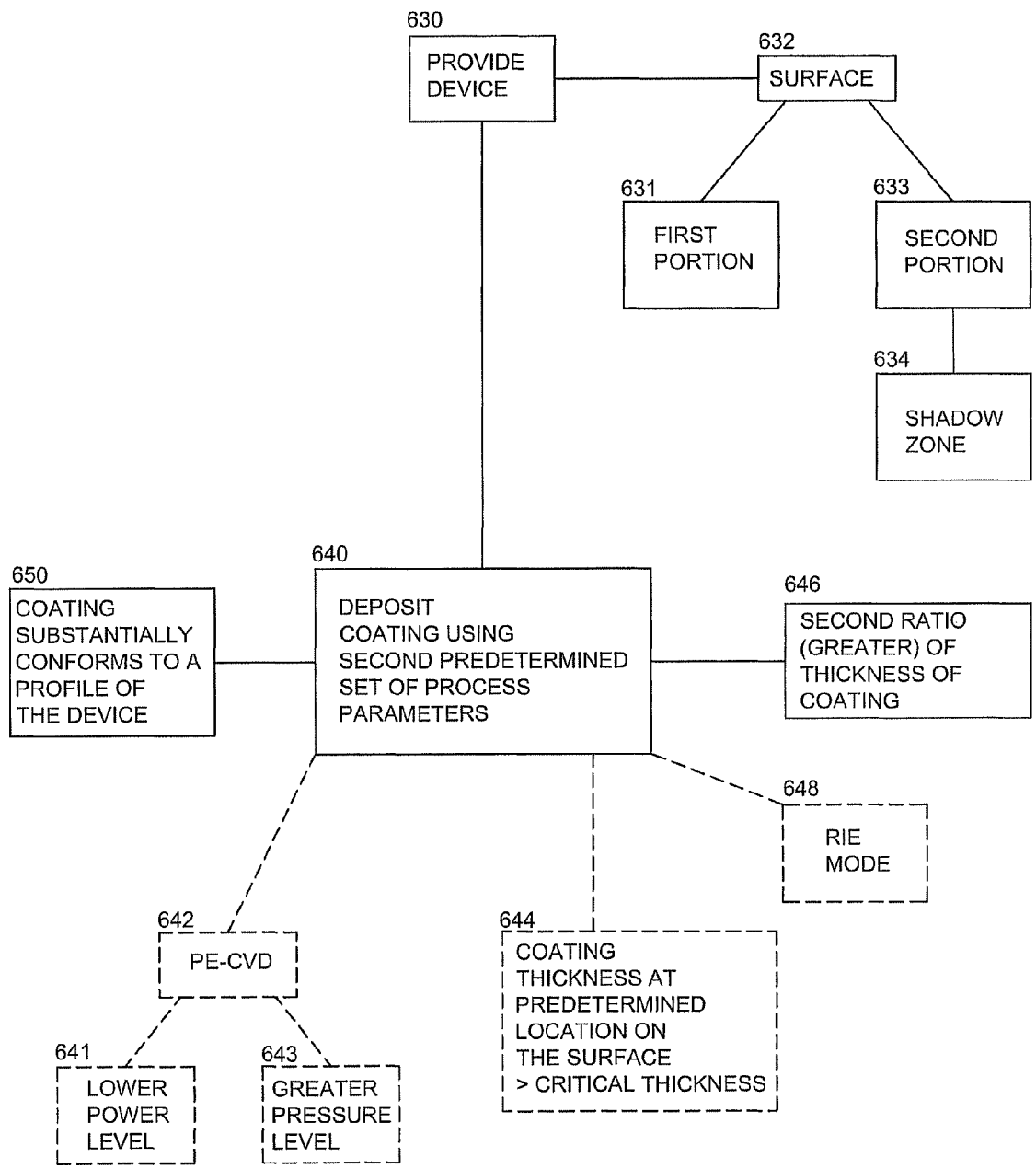
FIG. 6b is a flow chart for an improved method of depositing a coating on a device according to an embodiment of the present subject matter.

FIG. 6b illustrates a flow chart for an improved method of depositing a coating on a device according to an embodiment of the present subject matter. At block 630, the device is provided. In the present embodiment, the device comprises a surface 632 having a first portion 631 and a second portion 633. The second portion is in a shadow zone as depicted at block 634. The improvement over the baseline method disclosed in the present subject matter includes depositing a coating on the device using a second set of predetermined process parameters 640 such that the coating substantially conforms to a profile of the device as shown in block 650 and such that a second ratio of thickness of the coating 646 on the second portion to a thickness of the coating on the first portion is greater than the first ratio 626 disclosed in the baseline method.

In an embodiment of the present disclosure, the coating may comprise a substantially inorganic zone wherein the substantially inorganic zone further comprises a an inorganic material including, but not limited to, oxide, nitride, carbide, boride, and combinations thereof of elements of Groups IIA, IIIA, IVA, VA, VIA, VIIA, IB, and IIB, metals of Groups IIIB, IVB, and VB, and rare-earth metals. In another embodiment, the coating may comprise a substantially organic zone wherein said substantially organic zone may further comprise an organic material such as, but not limited to, carbon, hydrogen, and oxygen. The organic material may further comprise other minor elements, such as sulfur, nitrogen, silicon, etc., depending on the types of reactants. Reactants that result in an organic composition may include, but are not limited to: straight or branched alkanes, alkenes, alkynes, alcohols, aldehydes, ethers, alkylene oxides, and aromatics. For example, silicon oxycarbide may be deposited from plasmas generated from silane, methane, and oxygen or silane and propylene oxide. Silicon oxycarbide may also be deposited from plasmas generated from organosilicone radicals, such as tetraethoxysilane (TEOS), hexamethyldisiloxane (HMDSO), hexamethyldisilazane (HMDSN), or octamethylcyclotetrasiloxane (D4). In an additional embodiment, the coating may comprise a graded composition barrier coating. In an embodiment, the graded composition barrier coating may further comprise a material including, but not limited to, organic, inorganic, ceramic, and combinations thereof. In a further embodiment, the graded composition barrier coating may further comprise an organic and an inorganic material. In an exemplary embodiment of the present disclosure, a composition of the graded composition barrier coating varies substantially continuously across a thickness thereof.

In the present embodiment, the coating thickness deposited with the second set of predetermined process parameters may be thicker, at a predetermined location on the surface 632, than a critical thickness, herein defined as a thickness below which the coating cannot exhibit satisfactory oxygen and/or water vapor transmission rates through the coating (i.e. oxygen and water vapor transmission rates are higher than design performance criteria), and as depicted at block 644. In an embodiment, the second ratio of a thickness of the coating on the second portion to a thickness of the coating on the first portion is at least 0.1. In a separate embodiment, the second ratio of a thickness of the coating on the second portion to a thickness of the coating on the first portion is at least 0.3. The second predetermined set of process parameters may include one of many deposition coating techniques such as radio-frequency plasma-enhanced chemical-vapor deposition, expanding thermal-plasma chemical-vapor deposition, electron-cyclotron-resonance plasma-enhanced chemical-vapor deposition, inductively-coupled plasma-enhanced chemical-vapor deposition, and sputtering such as reactive magnetron sputtering, and combinations thereof. In an embodiment, the second predetermined set of process parameters includes plasma enhanced chemical vapor deposition (PECVD) process parameters as depicted at block 642. The second set of predetermined process parameters may further include a lower power level 641 and a greater pressure level 643 than the power level 621 and pressure level 623 of the first set of predetermined process parameters. In an alternate embodiment, the first predetermined set of process parameters includes PE mode deposition 628 and the second predetermined set of process parameters includes RIE mode deposition 648.

Figure 7A:
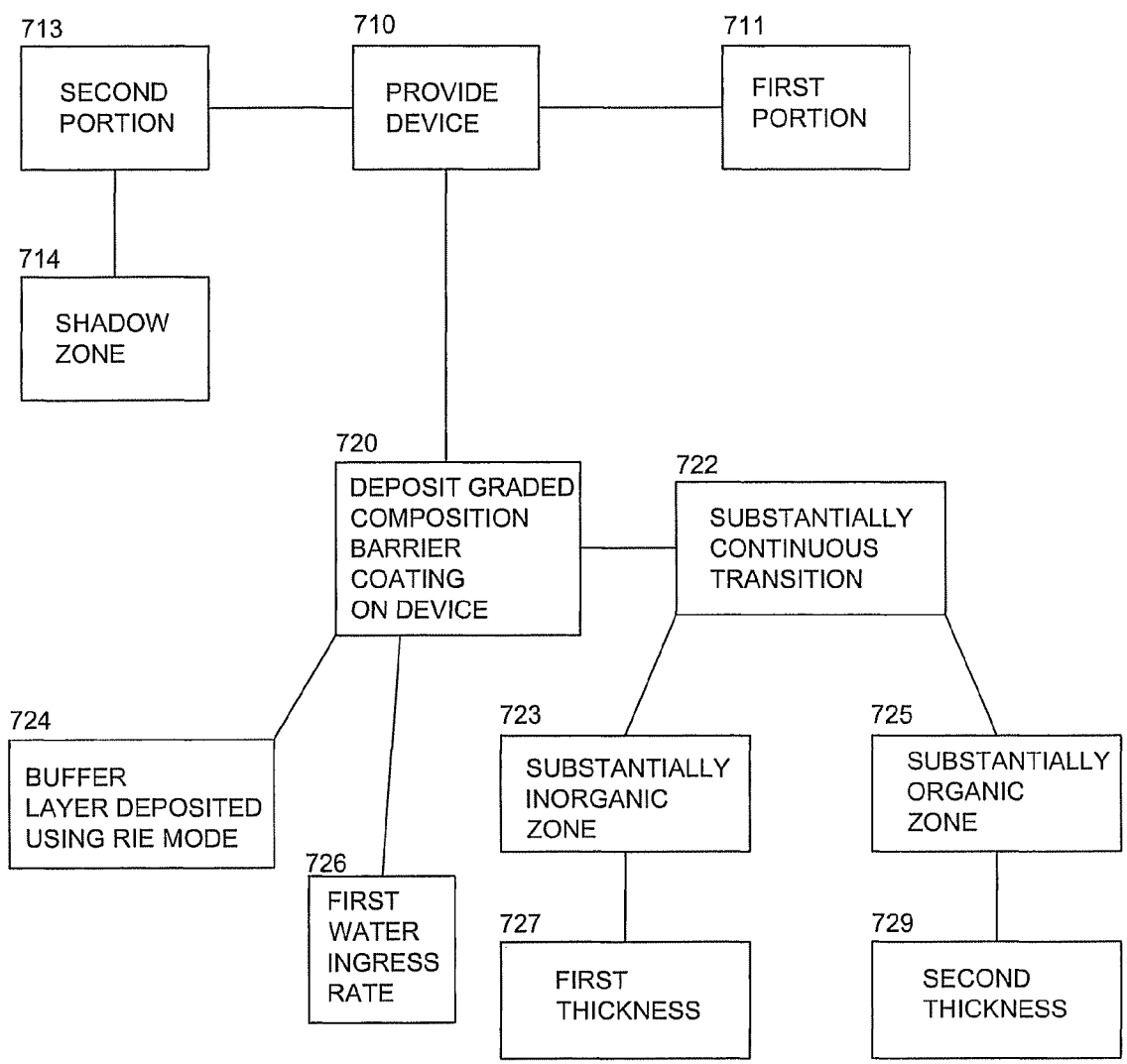
FIG. 7a is a flow chart for a baseline method of depositing a barrier coating on a device.

With reference to FIG. 7a, a flow chart is depicted for a baseline method of depositing a graded-composition barrier coating on a device. In the baseline method, a device is provided at block 710 having a first portion 711 and a second portion 713, where a surface of the second portion 713 is in a shadow zone 714. The first portion may be a substrate. The substrate may have properties such as flexibility. Flexibility as defined herein means being capable of being bent into a shape having a radius of curvature of less than about 100 cm. The substrate may have light transmissive properties; for example, it may be substantially transparent. The term "substantially transparent" as defined herein means allowing a total transmission of at least approximately 50 percent, preferably at least approximately 80 percent, and more preferably at least 90 percent, of light in the visible range (i.e. having a wavelength in the range from about 400 nm to about 700 nm). It may be composed of a variety of materials such as metal, plastic, glass, polymeric materials, etc.

The second portion may be an electronic device, photovoltaic device, organic light emitting diode, light emitting diode, liquid crystal display, radiation detector, electrochromic device, sensor or any combination of the aforementioned devices. In an exemplary embodiment of the present disclosure, the second portion is a passive matrix organic light emitting diode apparatus. In an embodiment of the present subject matter, the second portion may be substantially trapezoidal in shape. In an alternate embodiment, the second portion may be spherical in shape but those skilled in the art will recognize that many modifications and adaptations of the shape of the second portion are possible in any intentional lithographic structure, unintentional surface contamination particle, etc. and, as such, are part of the present subject matter.

At block 720, a graded-composition barrier coating is deposited on the device. In an embodiment, the graded composition barrier coating may further comprise a material including, but not limited to, organic, inorganic, ceramic, and combinations thereof. In an exemplary embodiment of the present disclosure, a composition of the graded composition barrier coating varies substantially continuously across a thickness thereof. In the baseline method, the graded-composition barrier coating has a buffer layer 724 deposited using RIE mode and a substantially continuous transition 722 from a substantially inorganic zone 723 deposited at a first thickness 727 to a substantially organic zone 725 deposited at a second thickness 729, resulting in a first water ingress rate 726. The graded-composition barrier coating 722 may be deposited using PECVD, however the graded-composition barrier coating 722 may be formed by one of many deposition techniques including, but not limited to, the techniques described in U.S. Pat. No. 7,015,640. The buffer layer 724 may be composed of an organic material such as, but not limited to, carbon, hydrogen, and oxygen. The organic material may further comprise other minor elements, such as sulfur, nitrogen, silicon, etc., depending on the types of reactants. Reactants that result in an organic composition may include, but are not limited to: straight or branched alkanes, alkenes, alkynes, alcohols, aldehydes, ethers, alkylene oxides, and aromatics. For example, silicon oxycarbide may be deposited from plasmas generated from silane, methane, and oxygen or silane and propylene oxide. Silicon oxycarbide may also be deposited from plasmas generated from organo-silicone radicals, such as tetraethoxysilane (TEOS), hexamethyldisiloxane (HMDSO), hexamethyldisilazane (HMDSN), or octamethylcyclotetrasiloxane (D4).

Figure 7B:
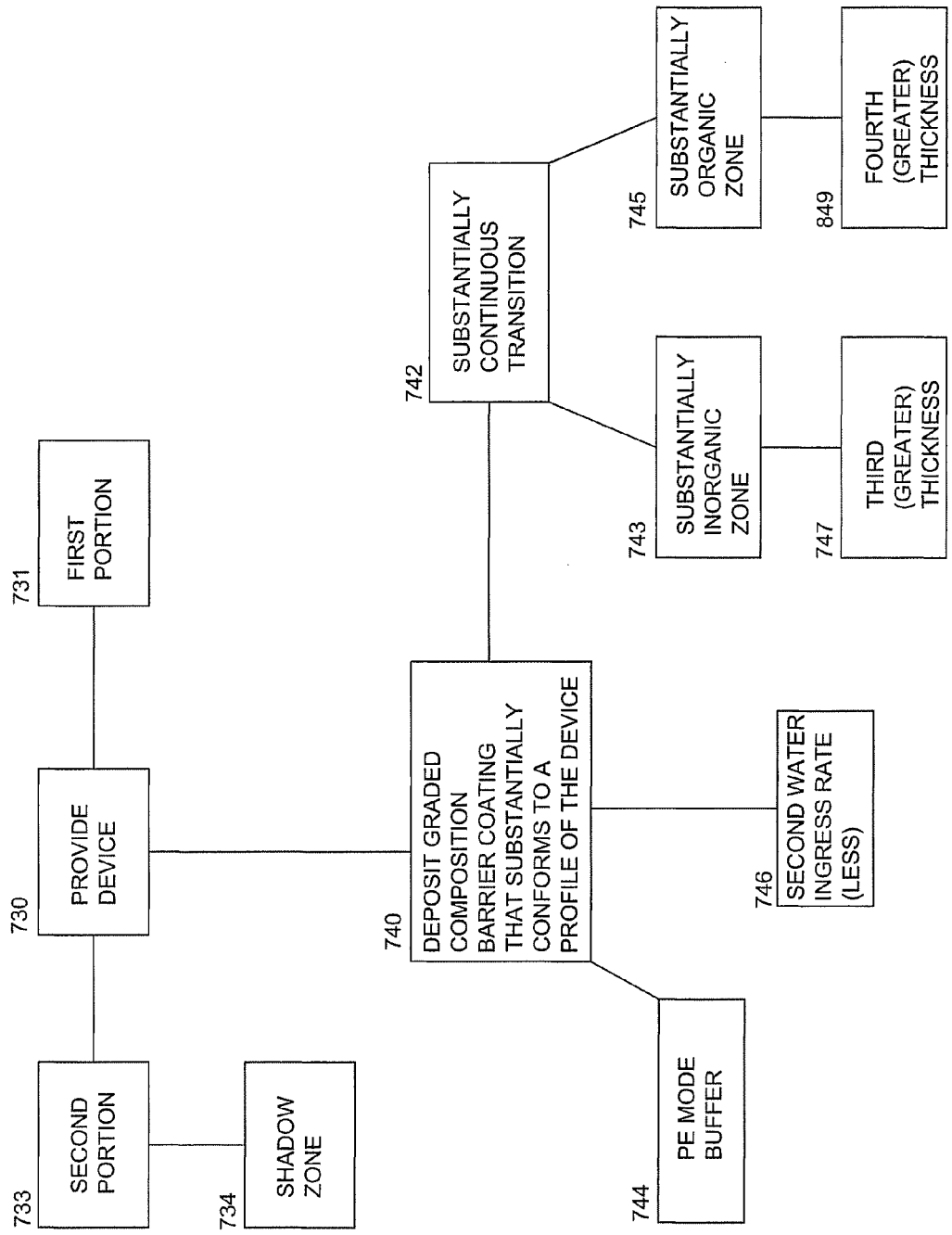
FIG. 7b is a flow chart for an improved method of depositing a barrier coating on a device according to an embodiment of the present disclosure.

FIG. 7b is a flow chart depicting an improvement of the baseline method for depositing a graded-composition barrier coating on a device according to an embodiment of the present disclosure. In the present embodiment, a device is provided at block 730 having a first portion 731 and a second portion 733, where a surface of the second portion 733 is in a shadow zone 734. The improvement over the baseline method disclosed in the present subject matter includes depositing the buffer layer 744 using PE mode, and having a substantially continuous transition 742 from depositing a substantially inorganic zone 743 at a third thickness and depositing a substantially organic zone 745 at a fourth thickness wherein the third thickness is greater than the first thickness, as shown at block 747, and the fourth thickness is greater than the second thickness, as illustrated in block 749, wherein the graded-composition barrier coating 740 substantially conforms to a profile of the device and resulting in a second water ingress rate 746 wherein the second water ingress rate 746 is less than the first water ingress rate 726. In an embodiment, the barrier coating 740 and the first portion 731 encapsulate the second portion 733.

Figure 8:
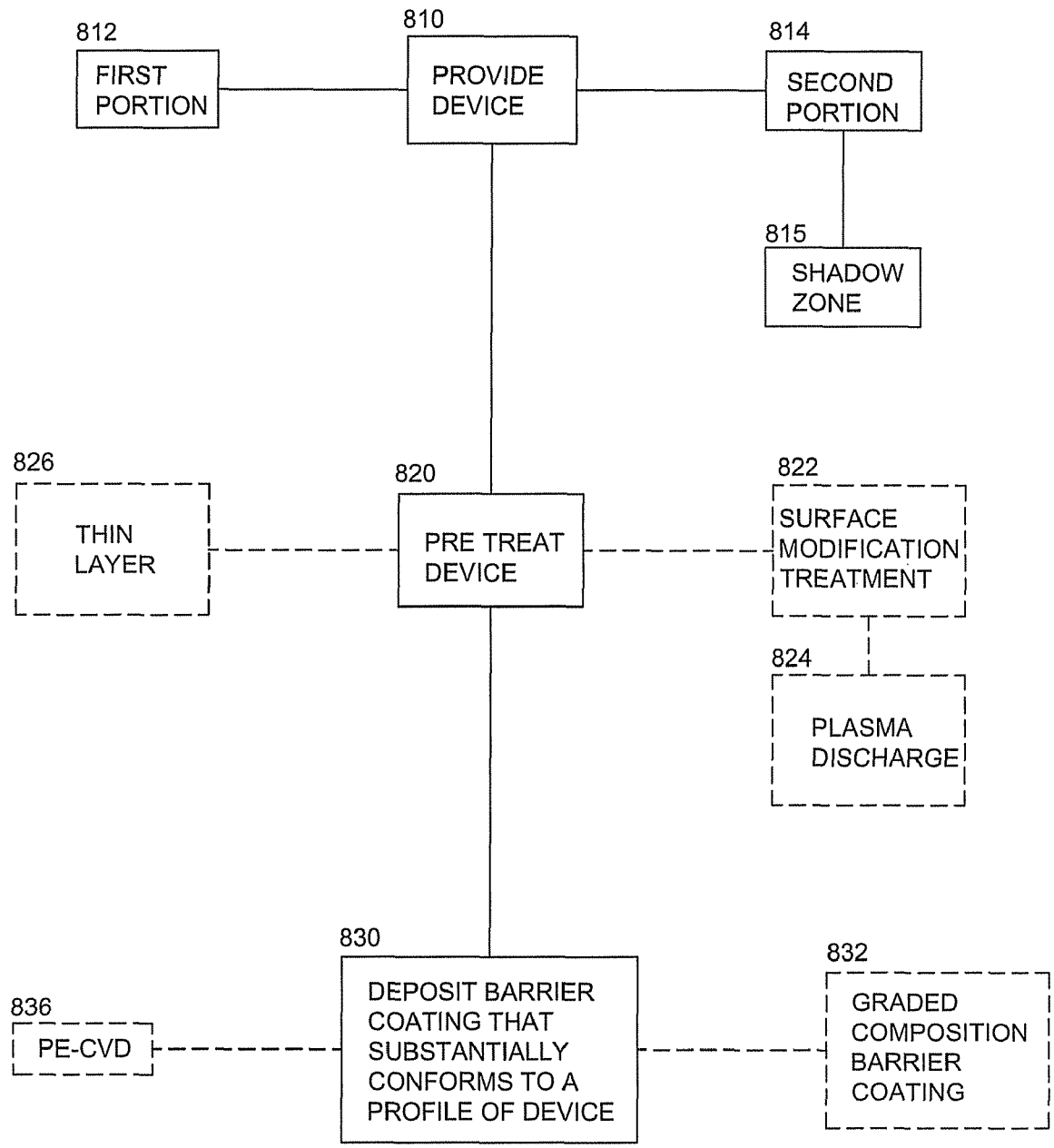
FIG. 8 is a flow chart for a method of depositing a barrier coating on a device comprising a shadow zone according to an embodiment of the present subject matter.

Considering now the flow chart shown in FIG. 8, the flow chart indicates a method for depositing a barrier coating on a device comprising a shadow zone according to an embodiment of the present subject matter. At block 810, a device is provided having a first portion 812 and a second portion 814 wherein a surface of the second portion 814 is in a shadow zone 815. For example, the first portion 812 may be a substrate. The substrate may be flexible and may also be substantially transparent. The substrate may be composed of a variety of materials such as metal, plastic, glass, polymeric materials, etc. The second portion 814 may be an electronic device, photovoltaic device, organic light emitting diode, light emitting diode, liquid crystal display, radiation detector, electrochromic device, sensor or any combination of the aforementioned devices. In an exemplary embodiment of the present disclosure, the second portion 814 is a passive matrix organic light emitting diode apparatus. In an embodiment of the present subject matter, the second portion 814 may be substantially trapezoidal in shape. In an alternate embodiment, the second portion 814 may be spherical in shape. One skilled in the art will recognize that many modifications and adaptations of the non-limiting examples provided for the first 812 and second 814 portions are possible and are part of the present subject matter.

At block 820 of FIG. 8, the device is pretreated wherein the pretreating alters a deposition rate of a barrier coating on a surface exposed to said pretreating and wherein said shadow zone is substantially unexposed to said pretreating. In an embodiment of the present disclosure, the pretreating is a surface modification treatment 822. One of skill in the art would understand that surface modification includes but is not limited to surface activation. In another embodiment of the present disclosure, the surface modification treatment is a plasma discharge 824. As a non-limiting example, the plasma discharge may include treatment gases such as inert gases (Argon, Helium, Nitrogen, etc.) or active gases (Nitrous oxide, Oxygen, Carbon dioxide, etc.). In an exemplary embodiment, the plasma discharge modifies the surface exposed to the pretreating and creates a lower energy surface to retard deposition of the barrier coating. In a further embodiment, the pretreating includes depositing a thin layer 826, wherein the thin layer 826 is an overlayer that affects the subsequently laid radicals.

At block 830, a barrier coating is deposited on the device wherein the barrier coating substantially conforms to a profile of the device. In an exemplary embodiment of the present disclosure, the barrier coating is deposited using plasma enhanced chemical vapor deposition 836. However, the barrier coating may be formed by one of many deposition techniques including, but not limited to, the techniques described in U.S. Pat. No. 7,015,640 such as radio-frequency plasma-enhanced chemical-vapor deposition ("RFPECVD"), expanding thermal-plasma chemical-vapor deposition ("ETPCVD"), electron-cyclotron-resonance plasma-enhanced chemical-vapor deposition ("ECRPECVD"), or inductively-coupled plasma-enhanced chemical-vapor deposition ("ICPECVD"). At block 830, the ratio of a thickness of the barrier coating in the shadow zone 815 to a thickness of the barrier coating not in the shadow zone may be at least 0.1. In an alternate embodiment, the ratio of a thickness of the barrier coating in the shadow zone 815 to a thickness of the barrier coating not in the shadow zone 815 may be at least 0.3.

Furthermore, as a non-limiting example, the barrier coating may be a graded composition barrier coating 832 comprising organic and inorganic material with a composition that varies substantially continuously across the thickness of the barrier coating such as a barrier coating described in U.S. Pat. No. 7,015,640. The barrier coating may also comprise organic, inorganic or ceramic material or combinations thereof. In an exemplary embodiment of the present subject matter, the barrier coating and the first portion encapsulate the second portion.

Figure 9A:
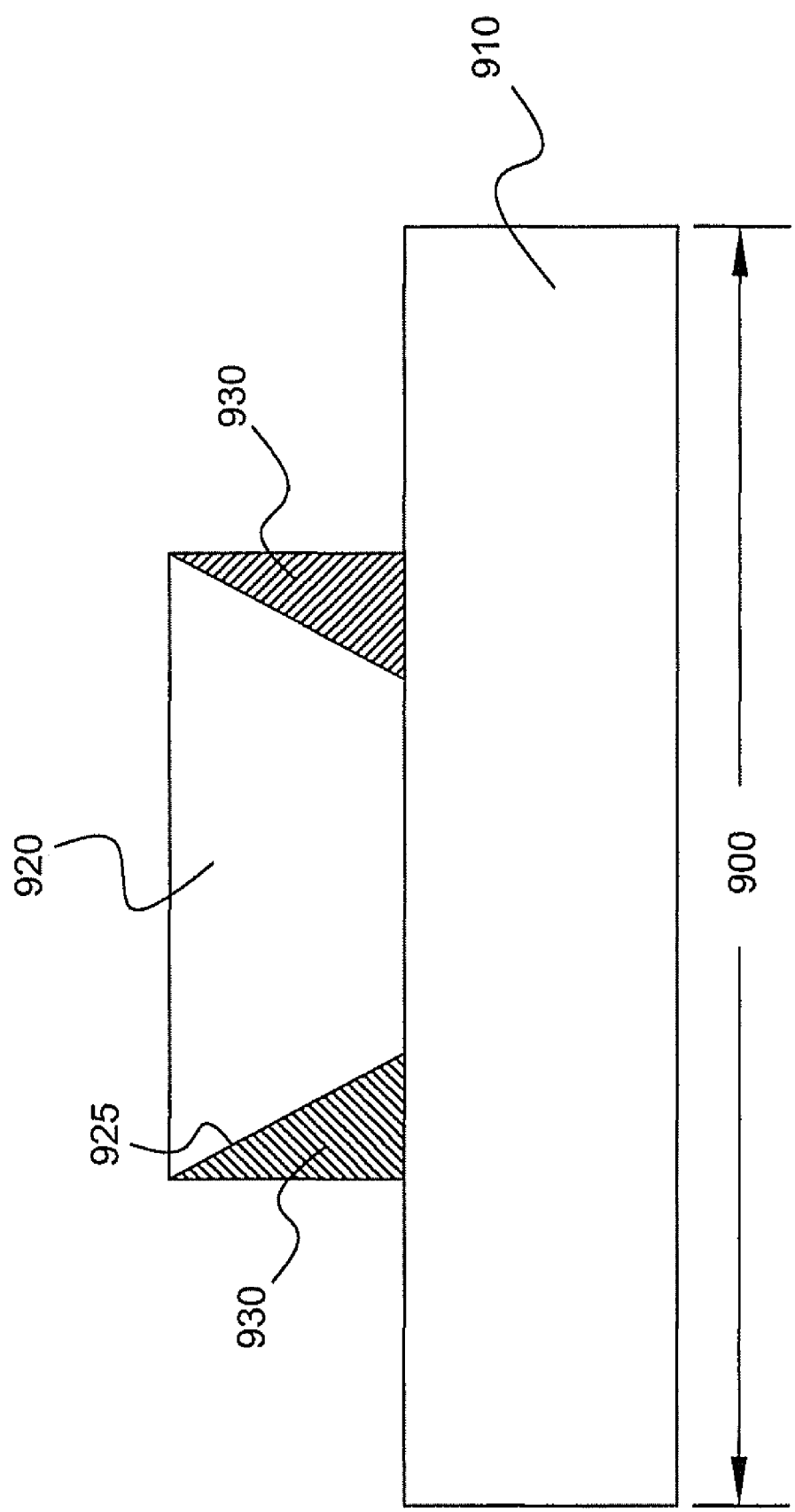
FIG. 9a illustrates the step in FIG. 8 of providing a device having a first and second portion wherein a surface of said second portion is in a shadow zone according to an embodiment of the present subject matter.
Figure 9B:
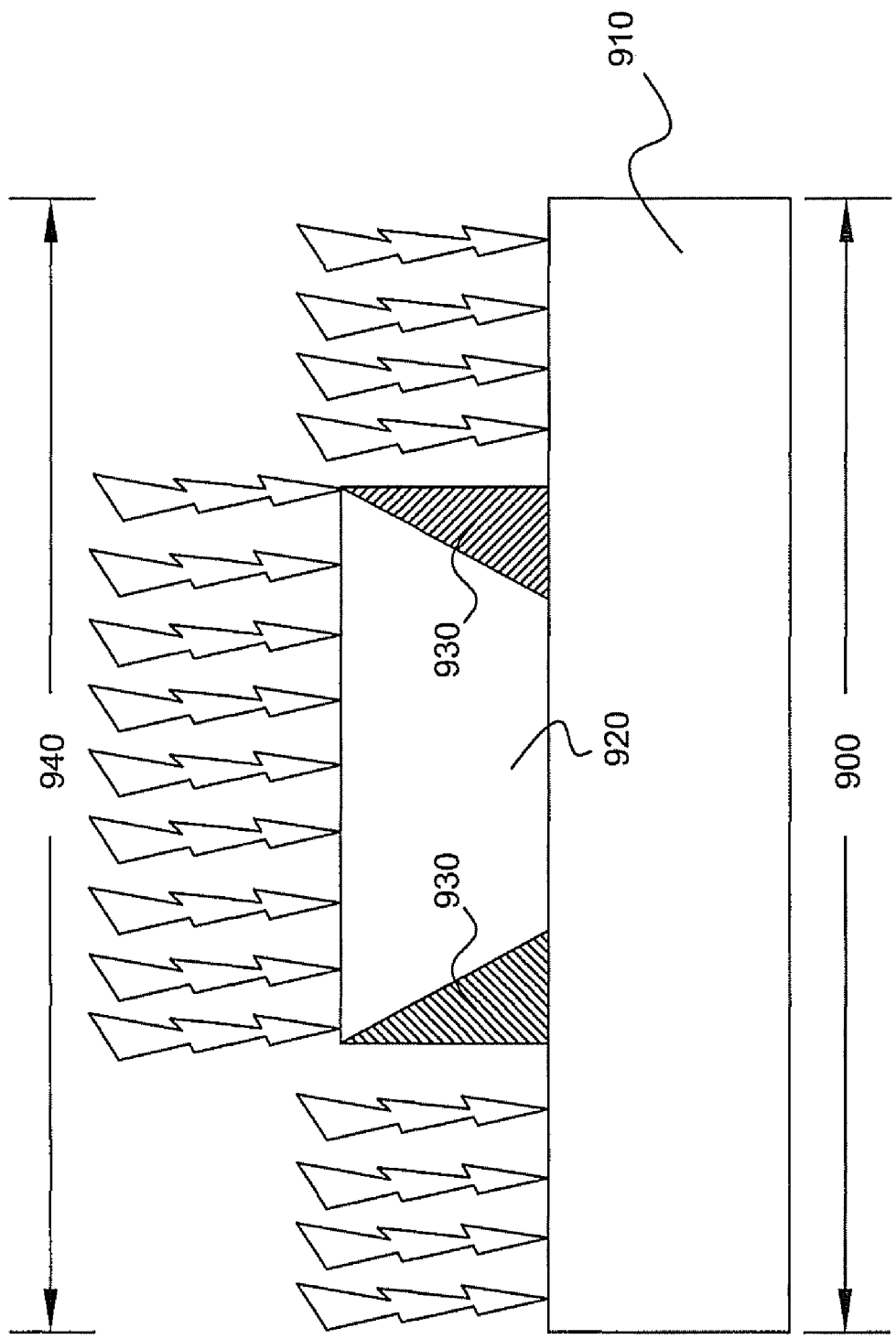
FIG. 9b shows the step in FIG. 8, of pretreating the device wherein the shadow zone is not exposed to the pretreating according to an embodiment of the present disclosure.
Figure 9C:
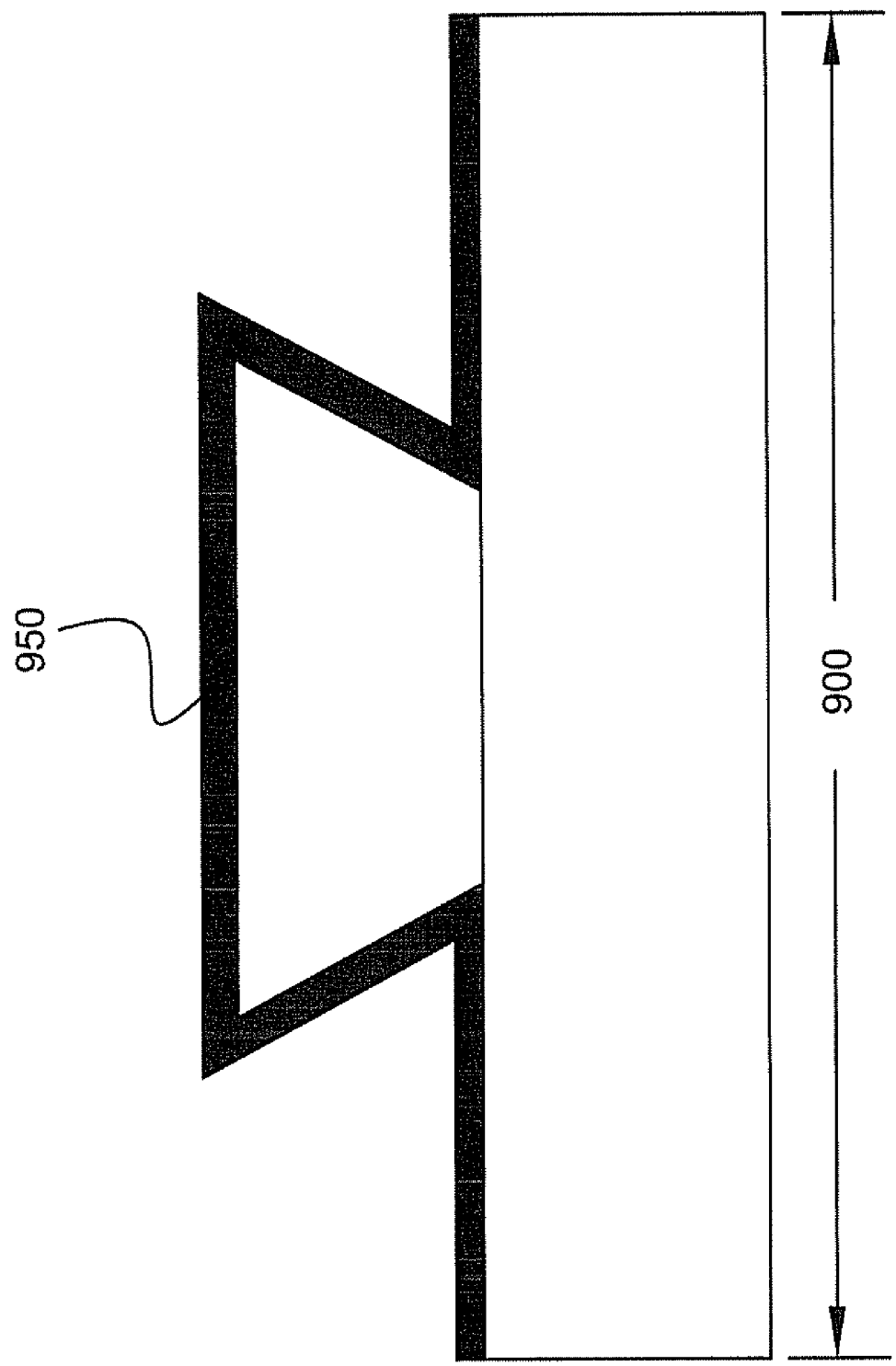
FIG. 9c depicts the step in FIG. 8 of depositing a barrier coating that substantially conforms to a profile of the device according to an embodiment of the present subject matter.

FIGS. 9a through 9c provide a non-limiting illustration of an embodiment of the method indicated in the flow chart of FIG. 8. With reference to FIG. 9a, a non-limiting example of the step of providing a device, illustrated at block 810, is depicted. A device 900 is provided, having a first portion 910 and a second portion 920. In the present embodiment, the second portion 920 is disposed on an upper surface of the first portion 910. The second portion is illustrated as a trapezoid, however, one of skill in the art will recognize that the second portion 920 may take the form of many possible shapes including, but not limited to a sphere, a polyhedron, etc. and all are part of the disclosure contained herein. Two separate shadow zones 930 are created between the second portion and the first portion from the surface topology of the device 900 of the present embodiment. The second portion 920 of the present disclosure has two distinct negatively sloped sidewall surfaces 925 that are each in a separate shadow zone 930.

FIG. 9b shows a non-limiting example of pretreating the device, depicted at block 820. In the present embodiment, the pretreatment is a plasma discharge surface modification treatment 940 wherein the shadow zone 930 is substantially unexposed to the pretreating and wherein the pretreatment alters a deposition rate of a barrier coating on a surface exposed to the plasma discharge surface modification treatment 940. In the present embodiment, the plasma discharge 940 modifies the surface exposed to the pretreating and creates a lower energy surface to retard deposition of the barrier coating.

FIG. 9c illustrates a non-limiting example of the step of block 830, depositing a barrier coating 950 that substantially conforms to a profile of the device 900 according to an embodiment of the present subject matter. In the present embodiment, the barrier coating is deposited using PECVD.

Figure 10:
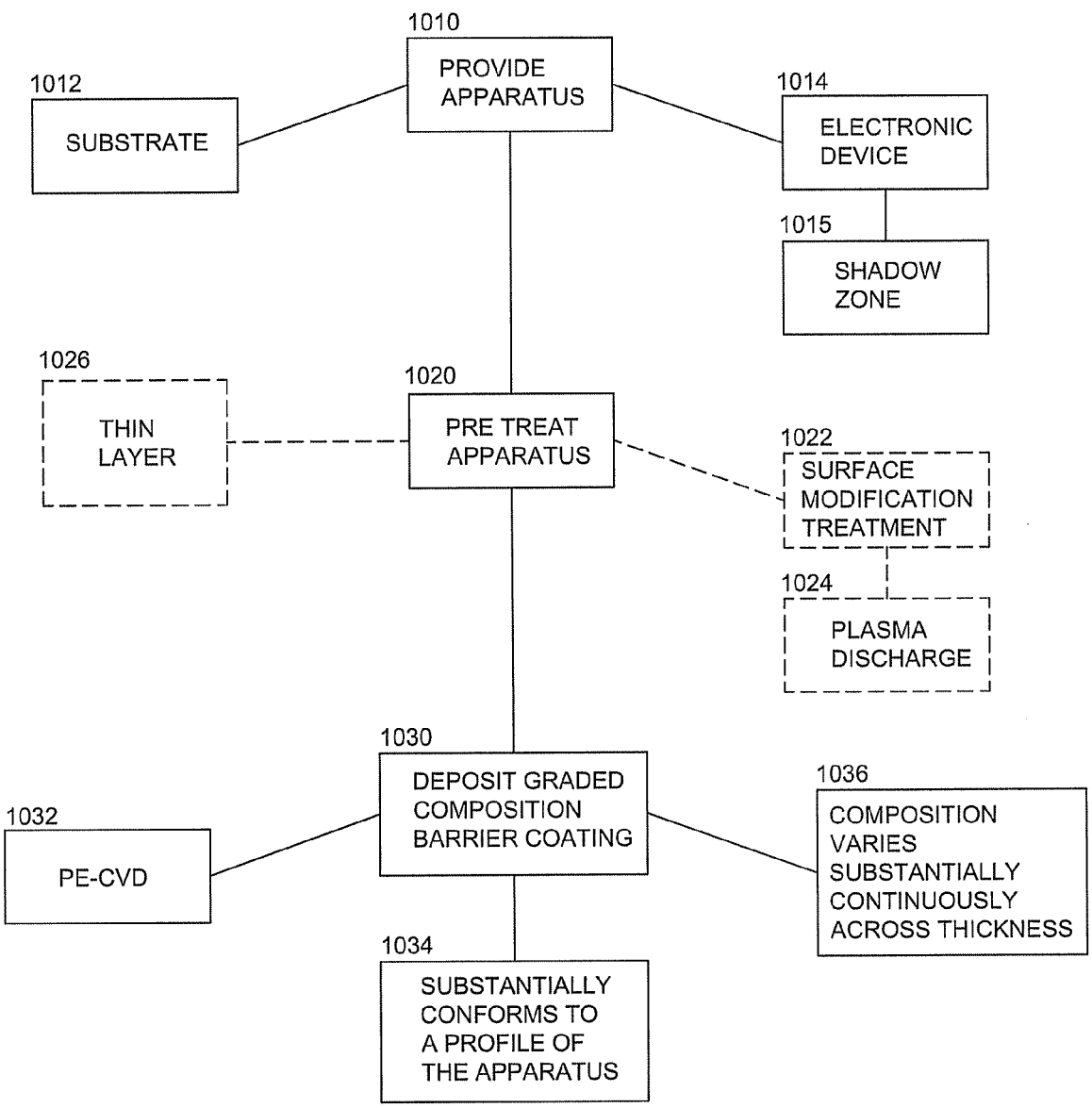
FIG. 10 is a flow chart for a method of depositing a graded composition barrier coating using plasma enhanced chemical vapor deposition on an apparatus according to an embodiment of the present subject matter.

The flow chart shown in FIG. 10 illustrates another method of depositing a barrier coating according to an embodiment of the present subject matter. Block 1010 provides an apparatus comprising a substrate 1012 and an electronic device 1014 wherein a surface of the electronic device is in a shadow zone 1015. The substrate 1012 may be flexible. The substrate 1012 may be substantially transparent of light in the visible light range. It may be composed of a variety of materials such as metal, plastic, glass, polymeric materials, etc. The electronic device 1014 may be a photovoltaic device, organic light emitting diode, light emitting diode, liquid crystal display, radiation detector, or any combination of the aforementioned devices. In an exemplary embodiment of the present disclosure, the electronic device 1014 is a passive matrix organic light emitting diode apparatus.

Block 1020 pretreats the apparatus wherein the pretreating alters a deposition rate on a surface exposed to the pretreating and wherein the shadow zone 1015 is substantially unexposed to the pretreating. In an embodiment, the pretreating is a surface modification treatment 1022. In another embodiment of the present disclosure, the surface modification treatment is a plasma discharge 1024. The plasma discharge 1024 may include, but is not limited to, treatment gases such as inert gases (Argon, Helium, Nitrogen, etc.) or active gases (Nitrous oxide, Oxygen, Carbon dioxide, etc.). In an exemplary embodiment, the plasma discharge modifies the surface exposed to the pretreating and creates a lower energy surface to retard deposition of said barrier coating. In an additional embodiment, the pretreating includes depositing a thin layer 1026, wherein the thin layer 1026 is an overlayer that affects the subsequently laid radicals.

Block 1030 deposits a graded-composition barrier coating using plasma enhanced chemical vapor deposition 1032 on the apparatus wherein the barrier coating is comprised of an organic and an inorganic material. The composition of the barrier coating varies substantially continuously across a thickness thereof 1034, and the barrier coating substantially conforms to a profile of the apparatus 1036. At block 1030, a ratio of a thickness of the barrier coating in the shadow zone to a thickness of the barrier coating not in the shadow zone may be at least 0.1 in an embodiment of the present disclosure. In an alternate embodiment, a ratio of a thickness of the barrier coating in the shadow zone to a thickness of the barrier coating not in the shadow zone may be at least 0.3.

In an embodiment, the barrier coating and substrate 1012 encapsulate the electronic device 1014. In an further embodiment, the water vapor ingress rate through the barrier coating is improved over a baseline method.

Figure 11:
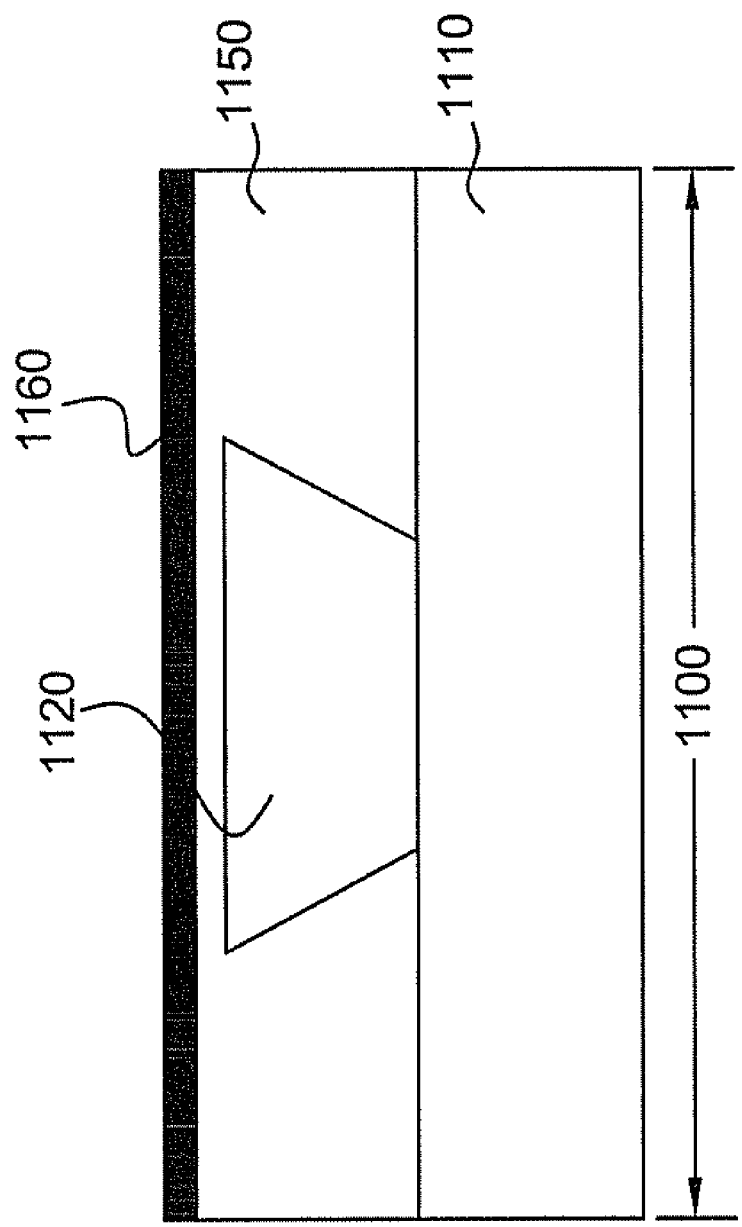
FIG. 11 shows an apparatus including a substrate, an electronic device having a shadow zone, a planarizing layer and a prior art non-conformal barrier coating.

FIG. 11 shows an apparatus 1100 of a similar geometric structure as the example of a device illustrated in FIG. 2, including a substrate 1110, an electronic device 1120 attached to the substrate 1110, a planarizing layer 1150 and a prior art non-conformal barrier coating 1160.

Figure 12:
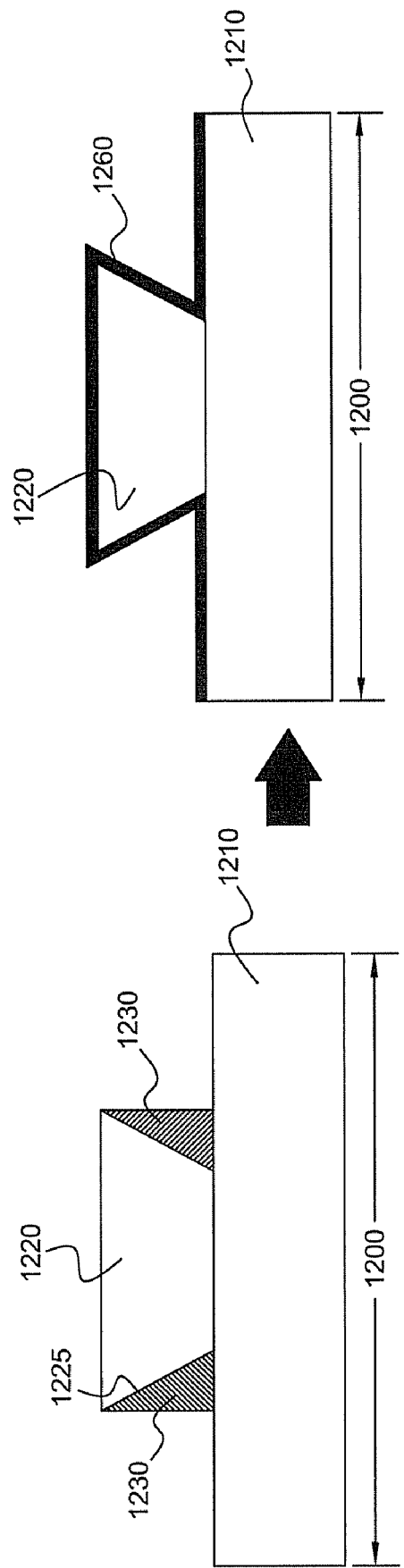
FIG. 12 shows an apparatus including a substrate, an electronic device having a shadow zone and a graded composition barrier coating that substantially conforms to a profile of the apparatus according to an embodiment of the present subject matter.

FIG. 12 shows an apparatus 1200 according to an embodiment of the present subject matter. The apparatus 1200 includes a substrate 1210, an electronic device 1220 attached to the substrate 1210 wherein a surface 1225 of the electronic device 1220 is in a shadow zone 1230 and has a deposition rate of a barrier coating different that a deposition rate of the barrier coating on a surface of the substrate 1210 outside of the shadow zone 1230, and a graded composition barrier coating 1260 that substantially conforms to a profile of the apparatus wherein the coating comprises an organic and an inorganic material the composition of which varies substantially continuously across a thickness thereof. The substrate 1210 may be flexible. The substrate 1210 may be substantially transparent of light in the visible light range. The substrate 1210 may be composed of a variety of materials such as metal, plastic, glass, polymeric materials, etc. The electronic device 1220 may be a photovoltaic device, organic light emitting diode, light emitting diode, liquid crystal display, radiation detector, electrochromic device, sensor or any combination of the aforementioned devices. In an exemplary embodiment of the present disclosure, the electronic device 1220 is a passive matrix organic light emitting diode apparatus.

In a further embodiment of the present subject matter, the graded-composition barrier coating 1260 and substrate 1210 encapsulate the electronic device 1220. In an embodiment of the present disclosure, the water vapor ingress rate is improved over a baseline method. A ratio of a thickness of the graded-composition barrier coating 1260 in the shadow zone 1230 to a thickness of the graded-composition barrier coating 1260 not in the shadow zone 1230 may be at least 0.1 according to an embodiment of the disclosure. In an alternate embodiment, a ratio of a thickness of the graded-composition barrier coating 1260 in the shadow zone 1230 to a thickness of the graded-composition barrier coating 1260 not in the shadow zone 1230 may be at least 0.3.

As shown by the various configurations and embodiments illustrated in FIGS. 1-12, a method for applying a conformal barrier coating, and an apparatus with a conformal barrier coating have been described.

While preferred embodiments of the present subject matter have been described, it is to be understood that the embodiments described are illustrative only and that the scope of the invention is to be defined solely by the appended claims when accorded a full range of equivalence, many variations and modifications naturally occurring to those of skill in the art from a perusal hereof.

Furthermore, the following examples are illustrative only and are not intended to limit the scope of the disclosure as defined by the appended claims. It will be apparent to those skilled in the art that various modifications and variations can be made in the methods and apparatus of the present subject matter without departing from the spirit and scope of the disclosure. Thus, it is intended that the present disclosure cover the variations and modifications of this disclosure provided that they come within the scope of the appended claims and their equivalents.

EXAMPLES

Figure 13:
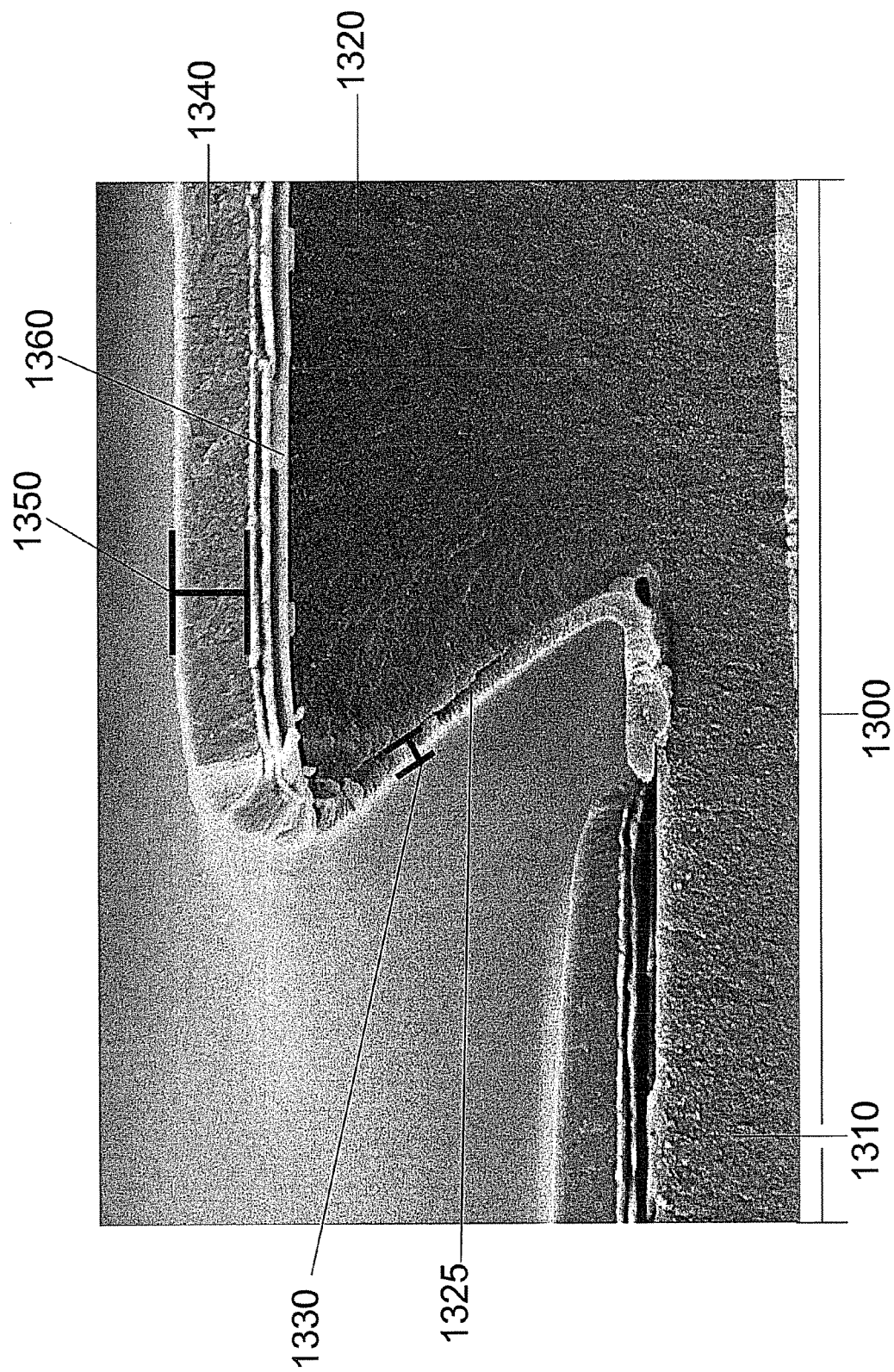
Figure 14:
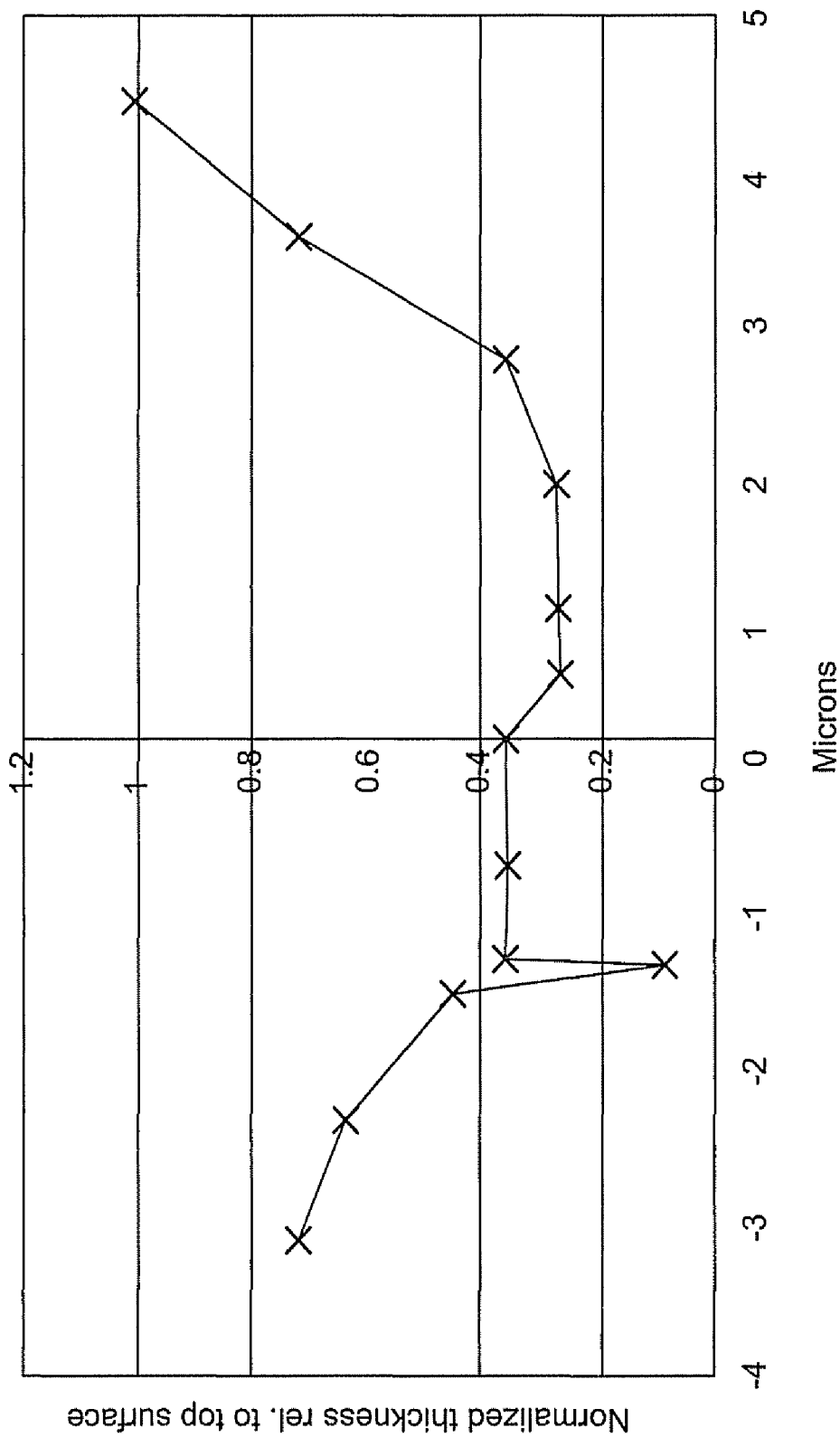

FIGS. 13 and 14 provide a non-limiting example of using the baseline method outlined in FIG. 6*a* on a device 1300. FIG. 13 illustrates a cross section of the device 1300 of the non-limiting example, whereby a trapezoid structure 1320 is disposed on a substrate 1310. A shadow zone is created by the geometry of the structure 1320 on the substrate 1310. FIG. 14 graphically represents the normalized thickness of a coating deposited on the device 1300 whereby the normalized thickness is the quotient of a thickness 1330 of a coating 1340 deposited on the device 1300 over a thickness 1350 of a coating 1340 deposited on a top surface 1360 of the structure 1320. Applying the baseline method of FIG. 6*a* to the non-limiting example of FIGS. 13 and 14, the second portion 613 is any portion of the side wall 1325 of the structure 1320 and the first portion 611 is any portion of the top surface 1360 of the structure 1320. In this example, the first ratio of a thickness of the coating on the second portion to a thickness of the coating on the first portion, depicted at block 626, is graphically displayed in FIG. 14 as the portion of the line connecting the plotted points corresponding to the normalized thickness of the coating deposited on the side wall 1325 of the structure 1320, namely the quotient of the thickness 1330 over the thickness 1350.

As depicted in FIGS. 13 and 14, a coating 1340 was formed on a substrate 1310 and a structure 1320 using a first set of predetermined process parameters including plasma enhanced chemical vapor deposition and tested for normalized thickness along the profile of the device 1300. The PECVD conditions used for the coating 1340 constitute a baseline condition for the coating. The first ratio of a thickness 1350 of the coating 1340 to a thickness 1330 of the coating 1340 was approximately 0.275.

Figure 15:
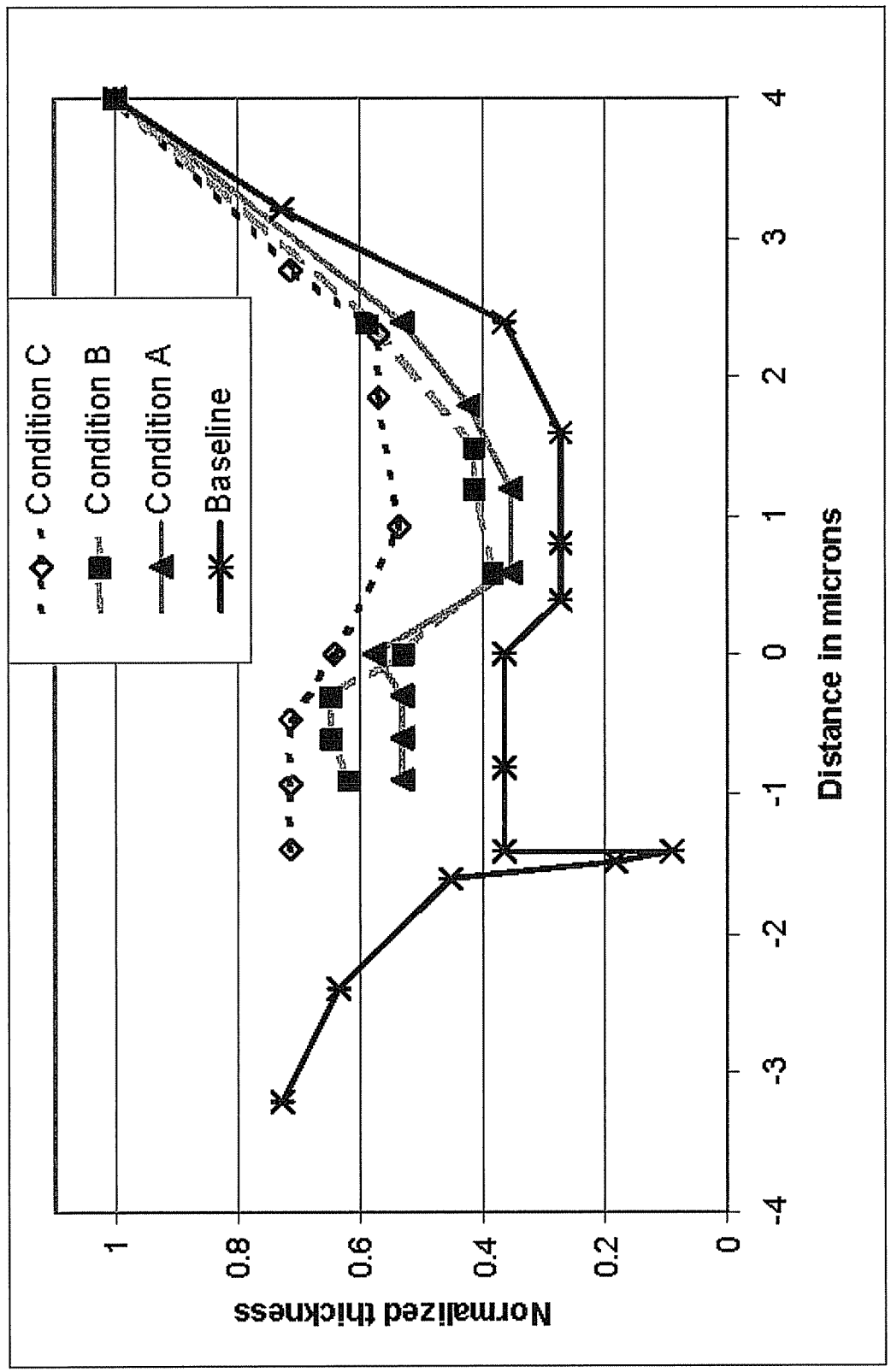
FIG. 15 compares the normalized thickness of the coating deposited on the device according to the non-limiting example of FIG. 13 using the baseline method of FIG. 6a with a normalized thickness of a coating deposited on a device using the improved method of FIG. 6b according to various non-limiting examples.

FIG. 15 compares the normalized thickness of a coating 1340 deposited on the device 1300 using the baseline method of FIG. 6*a* with the normalized thickness of a coating deposited on a device of the same geometric structure as the device 1300 using the improved method of FIG. 6*b* at various predetermined process parameters. The graphical line of interconnected plotted points representing normalized thickness of the coating 1340 of FIG. 14 is also depicted at FIG. 15, designated "Baseline". Similar to the non-limiting example depicted in FIGS. 13 and 14, during conduct of the remaining examples depicted in FIG. 15, the first portion 631 was the top surface 1360 of the structure 1320 and the second portion 633 was the side wall 1325 of the structure 1320.

In the remaining illustrated examples of FIG. 15, the second ratio of a thickness of the coating on the second portion 633 to a thickness of the coating on the first portion 631, depicted at block 646, is graphically displayed as the region of each of the various lines connecting the plotted points in FIG. 15 and corresponding to the normalized thickness of the coating 1340 deposited on the side wall 1325 of the structure 1320. The second set of predetermined process parameters as shown in the nonlimiting examples (Conditions A-C) of FIG. 15 include plasma enhanced chemical vapor deposition (PECVD) process parameters as depicted at block 642, a power level 641 less than a power level 621 of the first predetermined set of process parameters and a pressure level 643 greater than a pressure level 623 of the first predetermined set of process parameters.

In 3 consecutive tests (Conditions A-C in FIG. 15) power and pressure levels were varied with respect to the baseline conditions. In condition A, a 3×reduction in power level and 5×increase in pressure provides second ratio of a thickness of the coating 1340 of 0.35 compared to approximately 0.272 for Baseline. In condition B, a 633 reduction in power level and 5×increase in pressure provides second ratio of a thickness of the coating 1340 of about 0.41 compared to approximately 0.272 for Baseline. In condition C, a 12×reduction in power level and 5×increase in pressure provides second ratio of a thickness of the coating 1340 of about 0.55 compared to approximately 0.272 for Baseline. Conditions A-C clearly demonstrate increased conformality over Baseline condition for coating 1340.

Figure 16:
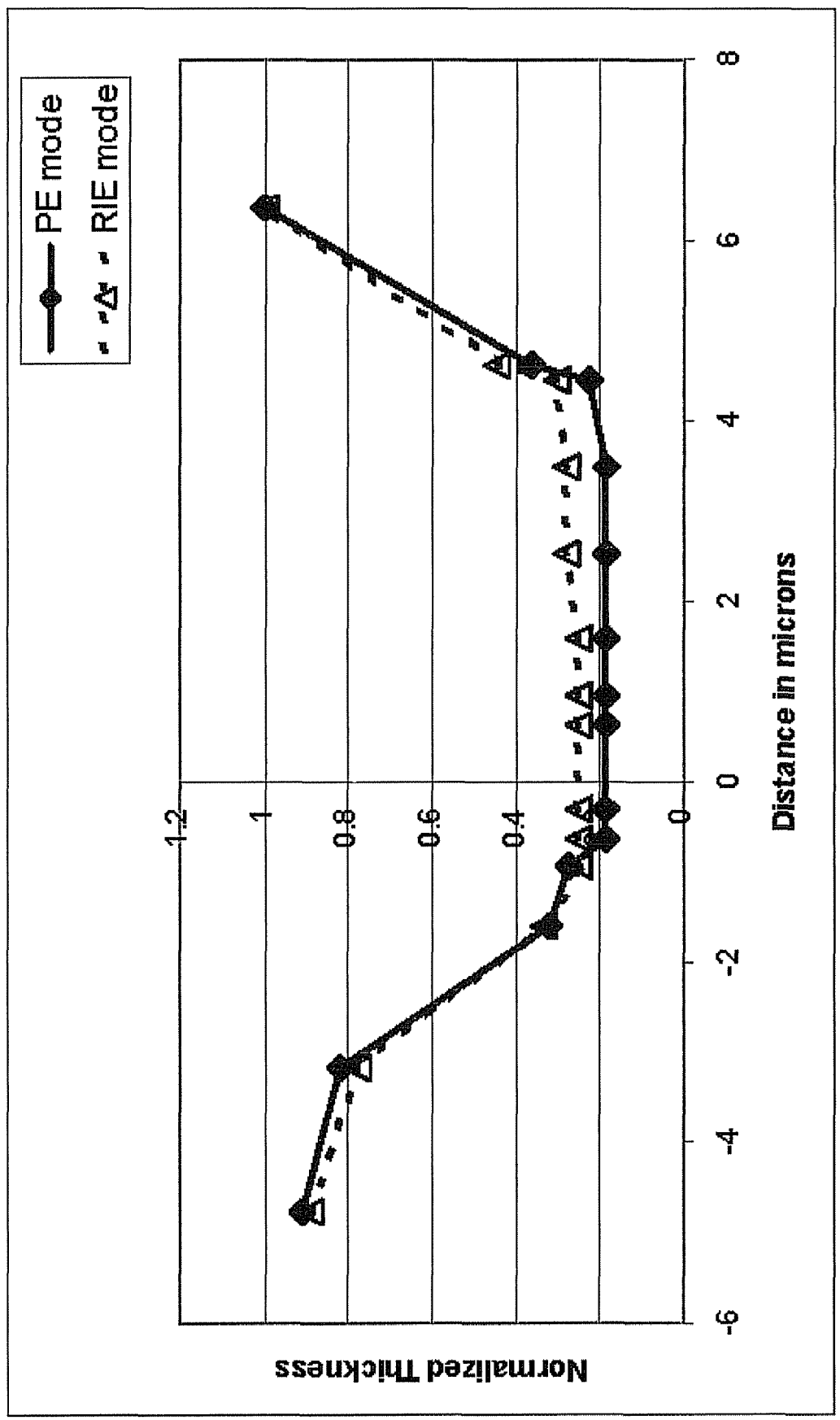
FIG. 16 compares the normalized thickness of a coating comprising a substantially organic zone deposited on a device according to a non-limiting example and using the baseline method of FIG. 6a with a normalized thickness of a coating comprising a substantially organic zone deposited on a device using the improved method of FIG. 6b according to a non-limiting example.

FIG. 16 compares the normalized thickness of a coating comprising a substantially organic zone deposited on a test structure of similar geometry to that depicted in FIG. 13 according to a non-limiting example and using the baseline method of FIG. 6*a* with a normalized thickness of a coating comprising a substantially organic zone deposited on a test structure of similar geometry to that depicted in FIG. 13 and using the improved method of FIG. 6*b* according to various non-limiting examples. A substantially organic zone was formed on the test structure using a first set of predetermined process parameters in PE mode and tested for normalized thickness along the profile of the device. The first ratio of a thickness on a side wall of the test structure in a shadow zone to a thickness of a top surface of the test structure was approximately 0.18. In a subsequent test, the second predetermined set of process parameters included depositing the substantially organic zone using RIE mode. The second ratio of a thickness of the substantially organic zone on a side wall of the test structure in a shadow zone to a thickness of a top surface of the test structure varied from approximately 0.25 to approximately 0.30.

Figure 17:
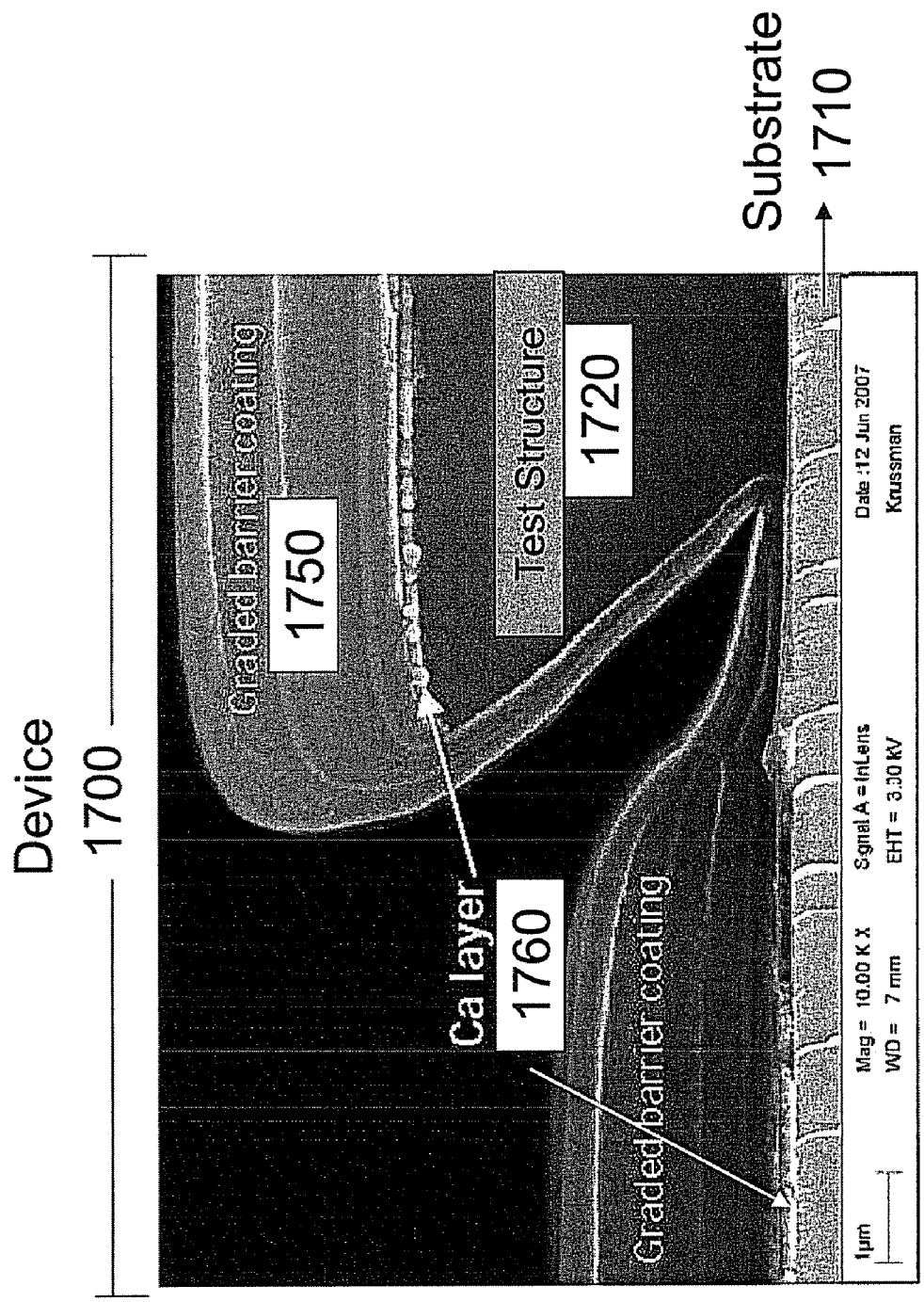
Figure 18:
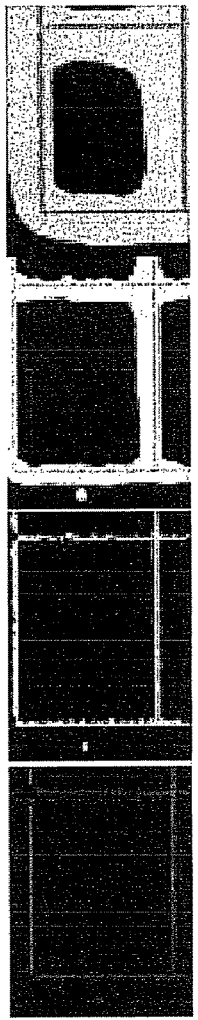

FIGS. 17 and 18 provide a non-limiting example of using the baseline method outlined in FIG. 7a on a device 1700. FIG. 18 shows a top down view of a test structure 1720 having a Calcium layer 1760 deposited on an upper surface of the test structure 1720 and a graded composition barrier coating 1750 deposited on a device 1700, and an ingress of water vapor at a junction of the test structure 1720 according to a non-limiting example using a baseline method of FIG. 7a. FIG. 17 shows a cross-sectional representation of a graded-composition barrier coating 1750 deposited on the device 1700 according to the non-limiting example using the baseline method of FIG. 7a. A shadow zone is created by the geometry of the structure 1720 on a substrate 1710. For the non-limiting example of FIGS. 17 and 18, the first portion 711 could be the substrate 1710 and the second portion 713 could be the substantially trapezoidal test structure 1720 where a surface of the second portion 713 is in the shadow zone.

As depicted in FIGS. 17 and 18, the graded-composition barrier coating 1750 was deposited on the device 1700. The graded-composition barrier coating 1750 included a buffer layer 724 deposited using RIE mode and a substantially continuous transition 722 from a substantially inorganic zone 723 at a first thickness 727 to a substantially organic zone 725 at a second thickness 729. During the conduct of a room temperature shelf life test of the device 1700, a first water ingress rate 726 including a lag time of less than 1 hour was observed to the Calcium layer 1760 and a Calcium layer 1760 corrosion rate of approximately 10-15 um/hr was further observed. The "lag time" herein refers to the time required for oxygen or water vapor to ingress the device and reach the Calcium layer. The "corrosion rate" herein refers to the subsequent degradation in the Calcium layer following expiration of the lag time.

Figure 19:
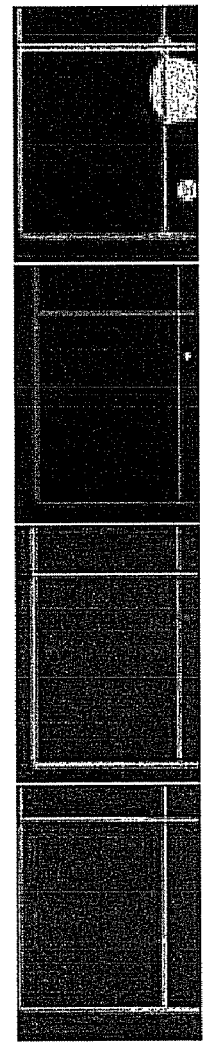
FIG. 19 shows a top down view of a test structure having a Calcium layer deposited on a surface of the test structure and the ingress of water vapor at a junction of the test structure during a room temperature shelf life test according to a non-limiting example using a modified thicker barrier coating design.

FIG. 19 illustrates a top down view of a test structure with a similar geometric shape of test structure 1720, having a Calcium layer deposited on an upper surface of the test structure, and a graded-composition barrier coating deposited on a device, similarly structured to the device 1700, and the ingress of water vapor at a junction of the test structure during a room temperature shelf life test according to a non-limiting example using a thicker graded composition barrier coating. Similar to the device 1700, the device of FIG. 19 had a first portion and a second portion where a surface of the second portion was in a shadow zone.

The graded composition barrier coating deposited on the device included a buffer layer deposited using RIE mode, and a substantially continuous transition from a substantially inorganic material deposited at a third thickness to a substantially organic material deposited at a fourth thickness of wherein the third thickness was greater than the first thickness and the fourth thickness was greater than the second thickness. During the conduct of a room temperature shelf life test of the device, an improved second water ingress including a lag time of greater than 869 hours was observed to the Calcium layer and a Calcium layer corrosion rate of approximately 0.01 um/hr was further observed.

Figure 20:
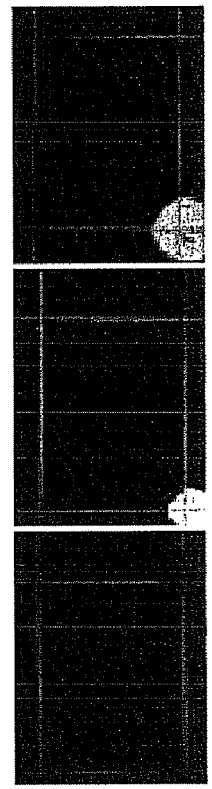
FIG. 20 shows a top down view of a test structure having a Calcium layer deposited on a surface of the test structure and the ingress of water vapor at a junction of the test structure during a room temperature shelf life test according to a non-limiting example using the improved method of FIG. 7b.

FIG. 20 illustrates a top down view of a test structure with a similar geometric shape of test structure 1720, having a Calcium layer deposited on an upper surface of the test structure, and a graded-composition barrier coating deposited on a device, similarly structured to the device 1700, and of the ingress of water vapor at a junction of the test structure according to a non-limiting example using the improved method of FIG. 7b. Similar to the device 1700, the device 730 of FIG. 20 had a first portion 731 and a second portion 733 where a surface of said second portion 733 was in a shadow zone 734.

The graded composition barrier coating deposited on the device 740 included buffer layer 744 deposited using PE mode, and a substantially continuous transition 742 from a substantially inorganic material 743 at a third thickness 747 to a substantially organic material 745 deposited at a fourth thickness 749 wherein the third thickness 747 was greater than the first thickness 727 and the fourth thickness 749 was greater than the second thickness 729. During the conduct of a room temperature shelf life test of the device, a second water ingress 746 including a lag time of greater than 1100 hours was observed to the Calcium layer at the time last data was collected and test was ongoing, no sufficient data was available to calculate a corrosion rate at the time.

We claim:
1. A method for depositing a barrier coating, comprising:
  (a) providing a device comprising a first portion and a second portion wherein a surface of said second portion is in a shadow zone;
  (b) pretreating said device wherein said pretreating alters a deposition rate of a barrier coating on a surface exposed to said pretreating and wherein said shadow zone is substantially unexposed to said pretreating; and
  (c) depositing a barrier coating on said device wherein said barrier coating substantially conforms to a profile of said device.
2. The method of claim 1 wherein said barrier coating is graded-composition barrier coating.
3. The method of claim 2 wherein said barrier coating comprises an organic and inorganic material.
4. The method of claim 3 wherein a composition of said barrier coating varies substantially continuously across a thickness thereof.
5. The method of claim 2 wherein said barrier coating comprises a material selected from the group consisting of: organic, inorganic, ceramic, and combinations thereof.
6. The method of claim 1 wherein said first portion comprises a substrate.
7. The method of claim 6 wherein said substrate is flexible.
8. The method of claim 6 wherein said substrate is substantially transparent.
9. The method of claim 1 wherein said second portion is selected from a group consisting of; electronic device, photovoltaic device, organic tight emitting diode, light emitting diode, liquid crystal display, radiation detector, eleotrochromic device, sensors and combinations thereof.
10. The method of claim 1 wherein said second portion comprises a passive matrix organic light emitting diode apparatus.
11. The method of claim 1 wherein said pretreating comprises a surface modification treatment.
12. The method of claim 11 wherein said surface modification treatment is a plasma discharge.
13. The method of claim 12 wherein said plasma discharge includes a gas selected from the group consisting of: an insert gas, argon, helium, nitrogen, nitrous, oxide, oxygen, carbon dioxide, and combinations thereof.
14. The method of claim 12 wherein said plasma discharge modifies said surface exposed to said pretreating and creates a lower energy surface to retard deposition of said barrier coating.

15. The method of claim 1 wherein said pretreating comprises depositing a thin layer and wherein said thin layer is an overlayer that a subsequently laid radical.

16. The method of claim 1 wherein said barrier coating and said first portion encapsulate said second portion.

17. The method of claim 1 wherein said second portion is substantially trapezoidal in shape.

18. The method of claim 1 wherein said second portion is substantially spherical in shape.

19. The method of claim 1 wherein a ratio of thickness of said barrier coating in said shadow zone is to a maximum thickness of said barrier coating not in said shadow zone is at least 0.1.

20. The method of claim 1 wherein a ratio of thickness of said barrier coating in said shadow zone to a maximum thickness of said barrier coating in said shadow zone is at least 0.3.

21. The method of claim 1 wherein said barrier coating is deposited using plasma enhanced chemical vapor deposition.

22. The method of claim 1 wherein said barrier coating is deposited using a method selected from a group consisting of: radio-frequency-plasma-enhanced-vapor-deposition, expanding thermal-plasma-chemical-vapor-deposition, electron-cyclotron-resonance plasma-enhanced chemical-vapor-deposition, inductively-coupled plasma-enhanced chemical-vapor deposition, sputtering, reactive magnetron sputtering and combinations thereof.

23. A method for depositing a barrier coating, comprising:
(a) providing an apparatus comprising a substrate and an electronic device wherein a surface of said electronic device is in a shadow zone;
(b) pretreating said apparatus wherein said pretreating alters a deposition rate of a barrier coating on a surface exposed to said pretreating and wherein said shadow zone is substantially unexposed to said pretreating; and
(c) depositing a graded-composition barrier coating using plasma enhanced chemical vapor deposition on said apparatus wherein said barrier coating comprises an organic and an inorganic material wherein a composition of said barrier coating varies substantially and continuously across at thickness thereof, and wherein said barrier coating substantially conforms to a profile of said apparatus.

24. The method of claim 23 wherein said substrate is flexible.

25. The method of claim 23 wherein said substrate is substantially transparent.

26. The method of claim 23 wherein said electronic device is selected from the group consisting of: photovoltaic device, organic light emitting diode, light emitting diode, liquid crystal display, radiation detector, electrochromic device, sensors, and combinations thereof.

27. The method of claim 23 wherein said electronic device comprises a passive matrix organic light emitting diode apparatus.

28. The method of claim 23 wherein said pretreating comprises a surface modification treatment.

29. The method of claim 28 wherein said surface modification treatment is a plasma discharge.

30. The method of claim 29 wherein said plasma discharge includes a gas selected from the group consisting of: an inert gas, argon, helium, nitrogen, nitrous oxide, carbon dioxide and combinations thereof.

31. The method of claim 29 wherein said plasma discharge modifies said surface exposed to said pretreating and creates a low energy surface to retard deposition of said barrier coating.

32. The method of claim 23 wherein said pretreating comprises depositing a thin layer and wherein said thin layer is an overlayer that affects a subsequently laid radical.

33. The method of claim 23 wherein said barrier coating and said substrate encapsulate said electronic device.

34. The method of claim 23 wherein a ratio of a thickness of said barrier coating in said shadow zone to a maximum thickness of said barrier coating not in said shadow zone is at least 0.1.

35. The method of claim 23 wherein a ratio of thickness of said barrier coating in said shadow zone to a maximum thickness of said barrier coating not in said shadow zone is at least 0.3.

36. The method of claim 23 wherein said barrier coating is deposited using a method selected fro the group consisting of: radio-frequency plasma-enhanced chemical-vapor deposition, expanding thermal-plasma chemical-vapor deposition, electron-cyclotron-resonance plasma-enhanced chemical-vapor deposition, inductively-coupled plasma-enhanced chemical-vapor deposition, sputtering, reactive magnetron sputtering, and combinations thereof.

* * * * *